United States Patent [19]

Curry

[11] Patent Number: 5,045,675

[45] Date of Patent: Sep. 3, 1991

[54] SERIAL PORT INTERFACE TO LOW-VOLTAGE LOW-POWER DATA MODULE

[75] Inventor: Stephen M. Curry, Dallas, Tex.

[73] Assignee: Dallas Semiconductor Corporation, Dallas, Tex.

[21] Appl. No.: 351,999

[22] Filed: May 15, 1989

[51] Int. Cl.⁵ .............................................. G06K 7/06
[52] U.S. Cl. .................................. 235/441; 235/492; 375/7
[58] Field of Search ....................... 235/436, 441, 492; 375/7

[56] References Cited

U.S. PATENT DOCUMENTS

| | | | |
|---|---|---|---|
| 3,585,399 | 6/1971 | Andrews | 375/7 X |
| 4,272,843 | 6/1981 | Schneider | 375/7 X |
| 4,556,958 | 12/1985 | Ugon | 235/492 X |
| 4,586,023 | 4/1986 | Thomson | 375/7 X |
| 4,621,190 | 11/1986 | Saito et al. | 235/492 |

Primary Examiner—David Trafton
Attorney, Agent, or Firm—Worsham, Forsythe, Samples & Wooldridge

[57] ABSTRACT

A signal interface to a low-cost portable electronic token data module, which can be used with a wide variety of computers, including a tremendous variety of personal and other computers, as long as the computer includes an interface to RS232 (or some comparable stardard). The token has a one-wire-bus interface, implemented in a battery-backed open-collector architecture, which provides a read/wire interface. The communication protocol expected by the token has been specified so that the token never sources current to the data line, but only sinks current. The communication protocol also includes time-domain relations which are referenced to a very crude time base in the token, and the system must preserve timing relations which will be satisfied by tokens in which the time base takes on any of the wide range of forseeable speeds. To interface to this protocol, the programmable capabilities of the standard UART chip in the computer's RS232 interface are exploited to provide adaptation to the time base requirements of the module. This is done by writing an entire byte of output from the UART, at a much higher baud rate than the module can be relied on to accept, to write a single bit of data into the module. The read-data line (RX) of the UART is tied back to the transmit-data line (TX) through a resistor, so that the UART will also always report a read of the same data byte being written, unless the token has turned on its pull-down transistor. An electrical network is used at the interface which (in effect) reverses the ground plane identification of the two leads, but which does provide the correct signal polarity to the token for signal discrimination in read mode.

3 Claims, 17 Drawing Sheets

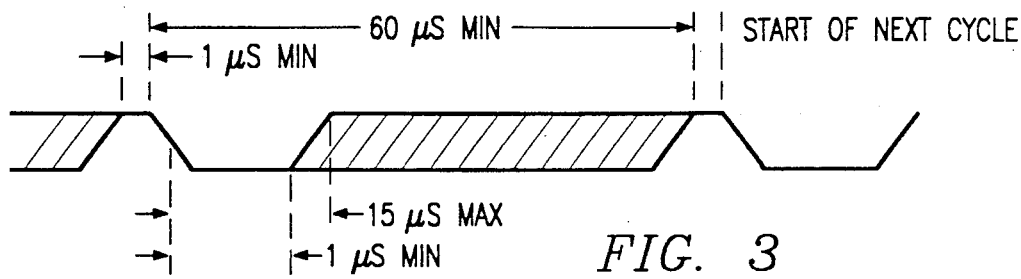
FIG. 3
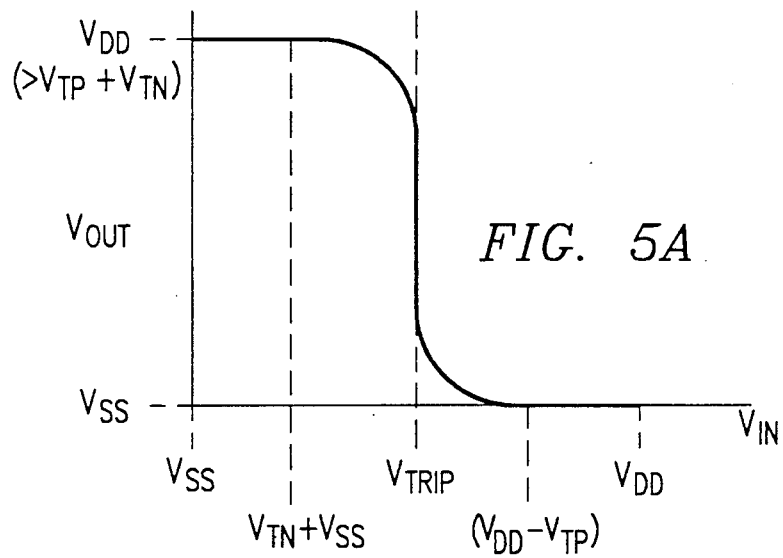
FIG. 5A
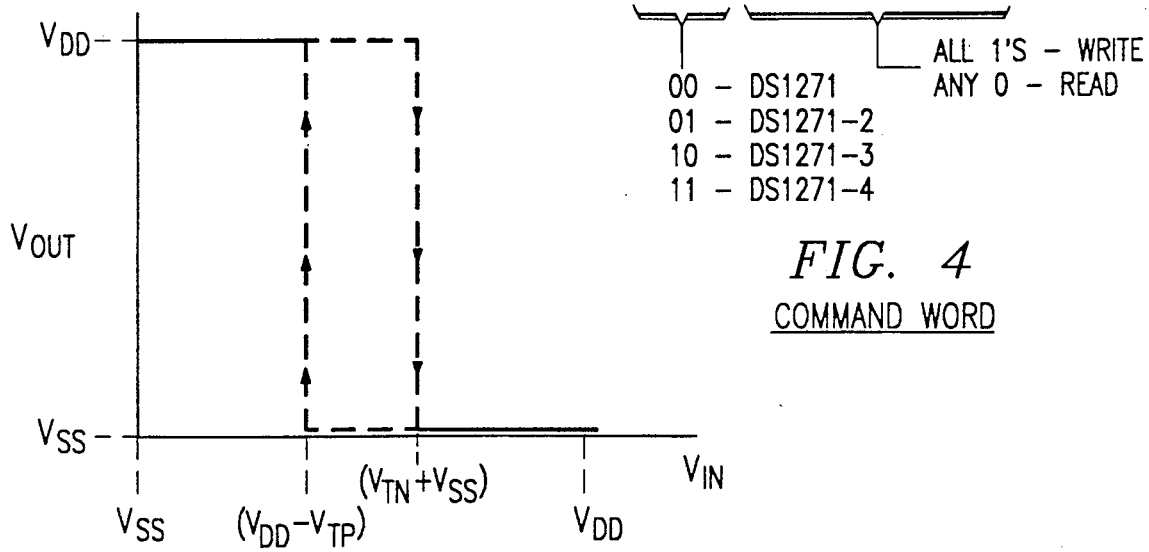
FIG. 5B
FIG. 4
COMMAND WORD

N-WELL

DEPLETION (INTERMEDIATE-DEPTH P-TYPE)

ACTIVE

N+ (COMPLEMENTED)

CONTACTS

PAD (PROTECTIVE OVERCOAT REMOVAL)

P+

METAL

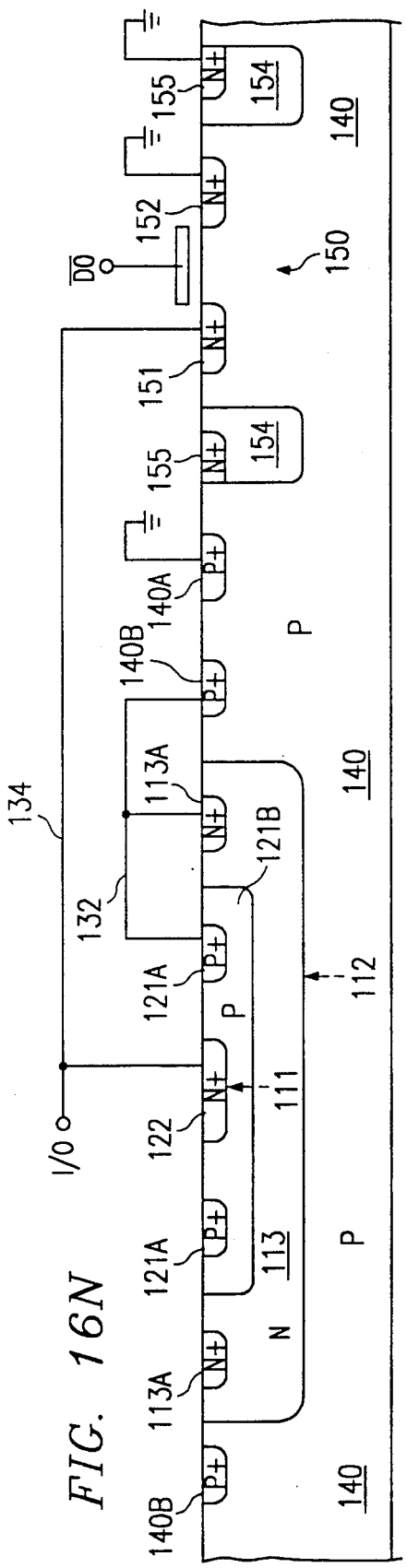
FIG. 16N
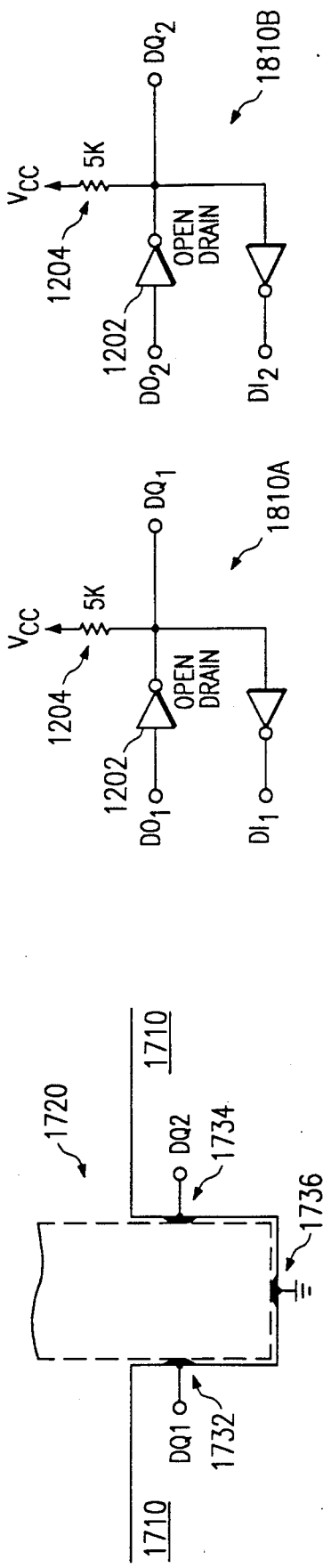
FIG. 18
FIG. 17

SERIAL PORT INTERFACE TO LOW-VOLTAGE LOW-POWER DATA MODULE

PARTIAL WAIVER OF COPYRIGHT

All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the copyright owner has no objection to the facsimile reproduction by anyone of the patent document or patent disclosure, as it appears in the United States Patent and Trademark Office patent file or records, but otherwise reserves all copyright rights whatsoever.

CROSS-REFERENCE TO OTHER APPLICATIONS

The following applications of common assignee contain related subject matter, and are believed to have effective filing dates identical with that of the present application:

Ser. No. 352,581, Filed May 15, 1989, entitled "ONEWIRE BUS ARCHITECTURE";

Ser. No. 351,759, Filed May 15, 1989, now U.S. Pat. No. 4,982,371 entitled "COMPACT ELECTRO-NIC MODULE";

Ser. No. 351,760, Filed May 15, 1989, entitled "COMPACT PACKAGE FOR ELECTRONIC MODULE";

Ser. No. 351,998, Filed May 15, 1989, now U.S. Pat. No. 4,972,377 entitled "LOW-VOLTAGE LOW-POWER STATIC RAM";

Ser. No. 352,598, Filed May 15, 1989, now U.S. Pat. No. 4,945,217 entitled "HAND-HELD WAND FOR READING ELECTRONIC TOKENS";

Ser. No. 352,596, Filed May 15, 1989, now U.S. Pat. No. 4,948,954 entitled "INTERFACE FOR RECEIVING ELECTRONIC TOKENS";

Ser. No. 352,142, Filed May 15, 1989 now U.S. Pat. No. 4,995,004 entitled "RAM/ROM HYBRID MEMORY ARCHITECTURE"; and Ser No. 351,997, Filed May 15, 1989, entitled "MODULAR DATA SYSTEM".

Ser. No. 345,144, filed Apr. 28, 1989, entitled "INTEGRATED CIRCUIT WITH IMPROVED PROTECTION AGAINST NEGATIVE TRANSIENTS"; all of which are hereby incorporated by reference.

BACKGROUND AND SUMMARY OF THE INVENTION

The present invention relates to electronic data systems, and particularly to systems, compatible with standard commo computer architectures, for accessing a compact electronic module over a one-wire bus.

Innovative Module

The present application discloses a very compact electronic module, which includes an integrated circuit (preferably including memory) and a battery. The module is preferably coin-shaped, and the two faces of the module are isolated from each other. Host systems can read/write access such modules, by using a one-wire-bus protocol.

Innovative Bus Organization

To communicate with this memory, in the preferred embodiment, an innovative one-wire bus protocol is used. This protocol is well adapted for interface to the low-cost architecture of the module of the presently preferred embodiment.

Time-Domain Relations

A bidirectional one-wire bus requires some use of time-domain or frequency-domain relations, to track the two half-channels of communication.

It is quite possible to put an accurate time base in a low-power integrated circuit, using CMOS oscillatorrs stabilized with quartz cyrstals; but the use of such techniques adds to the cost of the part. A crude time base can be provided simply by using an oscillator which is not stabilized. However, the response time of a simple timing circuit will be dependent on processing parameters. In conventional integrated circuit processing, there will normally be significant variation in parameters such as layer thickness, line-to-space ratio, and net dopant concentration in various locations. Thus, the electrical parameters, such as the series resistance of a polysilicon resistor of a given nominal dimension, can easily vary by ±20% or more, even in a well-controlled process. This means that the net speed of a timing circuit can vary by even more, since the net speed will be dependent on several electrical parameters, which may vary together or in opposition.

Parameter variation can be compensated for, by testing a newly fabricated wafer and programming elements on-chip (such as trimming capacitors) to adjust the net delay of timing elements; but this additional manufacturing step adds significant expense.

Low-Voltage CMOS Logic

Moreover, in a low-voltage CMOS system (i.e. where the supply voltage is less than the sum of the PMOS and NMOS threshold voltages), achieving even a crude time base is much more difficult. This is due to the transfer characteristics of a logic gate in this technology.

FIG. 5A shows the voltage transfer characteristics ($V_{OUT}$ graphed as a function of $V_{IN}$) for an inverter in conventional CMOS technology (e.g. where the supply voltage $V_{DD}$ is about 5 Volts, and the PMOS threshold voltage $V_{TP}$ and the NMOS threshold voltage $V_{TN}$ both have magnitudes in the range of about 0.8 V to 1.1 V.) Suppose that the input voltage $V_{IN}$ was initially at ground voltage $V_{SS}$ (0 V), so that the inverter's NMOS transistor is off and the inverter's PMOS transistor is on. Now, as $V_{IN}$ starts to rise, $V_{OUT}$ will stay at $V_{DD}$ until $V_{IN}$ rises to $V_{TN}$. At this point the NMOS device will start to pass current. However, the NMOS device will not be able to overpower the PMOS device until the voltge reaches a trip point $V_{TRIP}$. The trip point voltage $V_{TRIP}$ is well-defined for each particular logic gate, but is dependent on the device dimensions. (If the width of the PMOS device is increased, or the length of the PMOS device decreased, or the width of the NMOS device is decreased, or the length of the NMOS device increased, then the NMOS device will have more difficulty in overpowering the PMOS device, and the trip point $V_{TRIP}$ will occur at a higher voltage.) As the input voltage $V_{IN}$ increases, the NMOS device will pass more current and the PMOS device will pass less current, until at voltage $V_{DD}-V_{TP}$ the PMOS transistor turns off.

By contrast, the transfer characteristic of a low-voltage CMOS inverter, as shown in FIG. 5B, are quite different. (Suppose, for example, that $V_{DD}=1.5$ V, and $V_{TP}=V_{TN}=0.9$ V. Thus, note that FIGS. 5A and 5B are not drawn to the same scale.) Here there is no region where both the NMOS and PMOS devices are on. When the input voltage $V_{IN}$ increases above $V_{DD}-V_{TP}$ (0.6 V in this example), the PMOS device will turn off, but the NMOS device has not yet turned on. Therefore, until the input voltage increases to $V_{TN}$ (0.9 V in this example), the output node will be floated. (The node capacitance usually faces a fairly high-impedance load, and therefore, within the time normally required for the input voltage to swing across this voltage range, the output voltage will remain fairly constant. Moreover, a weak latch will typically be added to bridge this dead zone.) Thus, the transfer characteristic shown includes a significant hysteresis, since, between $V_{DD}-V_{TP}$ and $V_{TN}$, the output voltage is dependent on the direction of change of the input voltage.

Error of Crude Time Base

A response curve like that of FIG. 5B makes it more difficult to control the net delay of a circuit, since small changes in electrical parameters may produce large changes in the response characteristics. Thus, in such low-voltage technology, the frequency of an unstabilized oscillator may easily vary over a very large range (for example, over a range of 4:1), even in a well-controlled process.

The system of the presently preferred embodiment makes use of such an unstabilized oscillator to provide a crude time base within the module. This crude time base, together with electrical relationships, provides the necessary referent for communication over a one-wire bus. The use of a one-wire bus is very advantageous to the system user.

Electrical I/O Relationships

The bus protocol is also designed to minimize the charge transfer out of the battery in the module. This is done by using an "open-controller" type architecture. The protocol has been specified so that the module never sources current to the data line, but only sinks current.

When a data module is in contact with a host system, the host system initially pulls up the data line. (The module also preferably contains a very high-impedance pull-down resistor at this node, but this is included, in the preferred embodiment, merely to avoid the risk of floating nodes.) The host system initiates each stage of a data transfer operation by driving the data line low. The module detects this falling edge, and one of several further events cap then occur.

If the module is being read (as previously determined by overhead bits), the module, after seeing the falling edge which starts the cycle, either will or will not turn on its NMOS pull-down transistor, depending on the value of the data bit being read at that cycle. When the NMOS pull-down is turned on, the module lets its preset timing period elapse, and then turns off the NMOS pull-down. Thus, when the system wants to read from the module, it applies a falling edge, waits a short time to be sure that the module has received the falling edge, and then attempts to pull up the data line, using a pull-up resistor which is not strong enough to overpower the NMOS pull-down transistor in the module. After waiting a sufficient time the pull-up resistor to have raised the line to a high level (if the NMOS pull-down is off), the system tests the data voltage to ascertain the data bit. The system then waits for the maximum time period of the module delay to elapse, plus enough time for the data line to stabilize at a high level, and then sends another falling edge to read the next bit.

If the module is being written to (as previously determined by the overhead bits), the module, after seeing the falling edge which starts the cycle, waits for its preset timing period to elapse, and then stores the logic value of the data line. Thus, when the system wants to write to the module, it applies a falling edge, waits a short time to be sure that the module has received the falling edge, and then drives the data line either high or low, depending on the data bit. The system then waits for the maximum time period of the module delay to elapse, restores the data line to a high level, allows enough additional time for the data line to stabilize at a high level (and for the edge detector in the module to reset itself), and then sends another falling edge to write the next bit.

Block Transfer —Overhead and Reset

All data transfers are preferably done by reading or writing the entire contents of memory as a single serial stream. A short block of overhead bits, at the start of each transfer, defines the transfer type.

A further point of the protocol is a way to reset the module. Suppose, for example, that a module is pulled out of the slot in the middle of a data transfer, so that the memory pointer inside the module shows that the next bit to be written is bit number 117. The next system into which this module is inserted must not assume that the module's starting address is necessarily zero.

To make sure that the starting memory address of a newly inserted module is zero, as expected, the system sends a long string of write-zero commands, followed by a write-one command. The module contains simple sequential logic, which monitors the incoming bit stream for nonstop sequences of write-zero commands. If the module receives a nonstop sequence containing as many write-zero commands as the total length of the memory, the counter will freeze until the chip is reset. The chip will be reset if and only if an incoming "1" bit is seen while the counter is frozen.

This provides a reset capability, whereby the system can ensure that the starting address of the module is accurately known. Thus, on every insertion of a new module, the system can send such a reset sequence to initialize the address pointer in the module. Note that this address-pointer-reset is only necessary once per insertion. The sequence of write-zero commands will not normally destroy data, because the module never receives the overhead bit sequence which would tell it to enter write mode. (The only conditions under which data could be destroyed by these commands is when the module has been interrupted in the middle of a previous write sequence, and in this case the data may be presumed corrupt anyway.)

Of course, the data structures inside memory would normally include provisions for software error protection, such as overhead bits and checksum bits. However, a wide variety of such formatting schemes can be used, at the discretion of the user.

Innovative System Architecture

These innovative ideas are used as parts of a very innovative system architecture. The electronic module enabled by the innovative teachings herein is extremely compact and extremely cheap. From a systems point of view, this module is in some ways more analogous to a read/write bar code than to a conventional electronic memory system.

Macro-System Architecture

Thus, this innovative module can be used for price tags, for inventory tags, for work-in-process monitoring, for retail sales (to permit customers to select merchandise (e.g. by taking one module or a handful of modules to a cashier or to an automated check-out machine), without exposing the actual inventory to pilferage), and for a wide variety of other such compact data-transfer applications. Thus, the innovative module described can be regarded as an electronic token, which is as portable and rugged as a metal token, but which is far more versatile.

This provides an innovative large-scale systems architecture, wherein multiple host systems can each interface to small electronic "tokens." The tokens are small coin-shaped two-terminal read/write data modules, and are compact, rugged, and extremely cheap. Each of the tokens contains only two external contacts, a battery, and a small amount of memory. The memory is serially accessible, using a one- wire-bus protocol which minimizes the drain on the battery.

Electrical Interface from Token to Standard RS232 Interface

The presently preferred embodiment also uses an innovative electrical interface to the tokens, which permits interfacing to tokens with a wide variety of computers, including a tremendous variety of personal or other computers, as long as the computer includes an interface to RS232 (or some comparable standard). The token has a one-wire-bus interface, implemented in a battery-backed open-collector architecture, which provides a read/write interface. The communication protocol expected by the token has been specified so that the token never sources current to the data line, but only sinks current. The communication protocol also includes time-domain relations which are referenced to a very crude time base in the token, and the system must preserve timing relations which will be satisfied by tokens in which the time base takes on any of the wide range of foreseeable speeds. To interface to this protocol, the programmable capabilities of the standard UART chip in the computer's RS232 interface are exploited to provide adaptation to the time base requirements of the module. This is done by writing an entire byte of output from the UART, at a much higher baud rate than the module can be relied on to accept, to write a single bit of data into the module. The read-data line (RX) of the UART is tied back to the transmit-data line (TX) through a resistor, so that the UART will also always report a read of the same data byte being written, unless the token has turned on its pull-down transistor. An electrical network is used at the interface which (in effect) reverses the ground plane identification of the two leads, but which does provide the correct signal polarity to the token for signal discrimination in read mode.

Physical Interface for Receiving Electronic Tokens

Preferably each host system uses a physical configuration of electrical contacts which provides rapid contact for electronic data modules (tokens). A slot, dimensioned to receive electronic tokens, includes a grounded contact positioned to make contact to the edge of a token which may be inserted, and two data contacts which are positioned to make contact to the opposite faces of the token. Each of the data contacts is connected to an open-collector driver circuit, including a pull-up resistor which will bring the potential of the contact high when the slot is empty. The token is shaped so that its edge, and one of its faces, are connected to the token's ground line, and the other face is the token's data line. Thus, when a token is inserted (no matter which way the token is facing), one of the two data contacts will be immediately pulled to ground, by short-circuiting across the ground plane of the token. The system can thereby recognize that a token has been inserted, and that the other data contact (the one which was not shorted to ground) can communicate with this token's data line. Thus, even though the token itself is asymmetric, and even though the directional orientation of the token is not initially known to the system, no physical asymmetry needs to be introduced into the token or the slot to assure proper data interface.

Alternative Physical Interface —Hand-Held Wand

A wand which provides rapid contact to a two-terminal electronic token data module. The wand includes one contact which will make contact to the periphery of an electronic token which the wand is pressed against, and one contact which will make contact to the center of the token. Preferably the wand includes a base portion which is shaped to be worn on the second joint of a user's finger. This wand can be used for very rapid manual contacting of electronic tokens in various physical positions. This can be very advantageous in a variety of data collection/updating applications such as retail checkout, or tracking work-in-progress in a computer-assisted-manufacturing environment.

BRIEF DESCRIPTION OF THE DRAWING

The present invention will be described with reference to the accompanying drawings, which show important sample embodiments of the invention and which are incorporated in the specification hereof by reference, wherein:

Fig. 1A shows a version using a packaged integrated circuit on a flexible circuit board, and FIG. 1B shows a version using a chip-on-board mounting with a rigid circuit board.

FIG. 3 is a timing diagram of a read operation, in the module of the presently preferred embodiment.

FIG. 4 shows the format of the overhead bits used for each block data transfer operation, in the module of the presently preferred embodiment.

FIG. 5A shows the voltage transfer characteristics ($V_{OUT}$ graphed as a function of $V_{IN}$) for a typical inverter in conventional CMOS technology (where $V_{DD} > V_{TP} + V_{TN}$), and FIG. 5B shows the transfer characteristic for a typical inverter in a low-voltage CMOS technology (where $V_{DD} < V_{TP} + V_{TN}$).

FIGS. 16A through 16N relate to several embodiments of an innovative battery protection diode, of which one version is preferably used in the integrated circuit of FIG. 6. It should be appreciated that these drawings are not necessarily drawn to scale, and, in particular, that some of the vertical dimensions in the device sections shown have been exaggerated for clarity.

FIGS. 16A-1 to 16A-8 show the layout of the ESD protection diode, in the presently preferred embodiment.

FIG. 16N shows a further alternative embodiment, wherein a diffusion structure is connected to provide ESD protection for an I/O connection of a battery-powered integrated circuit.

FIG. 17 shows the configuration of contacts used, in one embodiment, in a host system to contact electronic tokens.

FIG. 18 shows the electrical driver configuration used on the host side, in one class of embodiments, to interface to electronic tokens.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Physical Packaging of Module

Figure 1A:
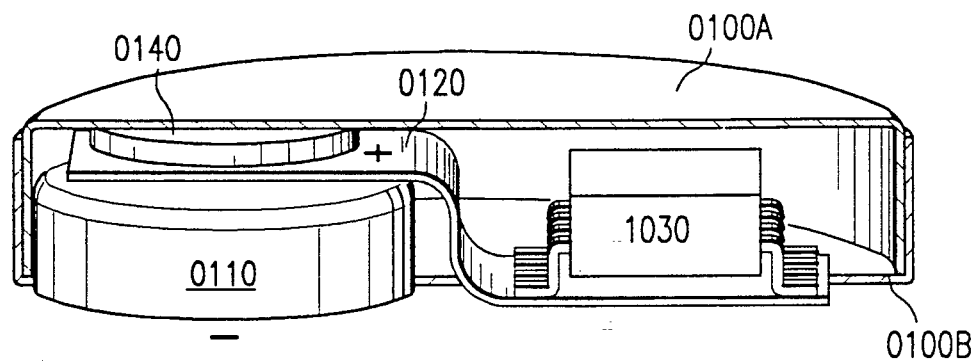
FIGS. 1A and 1B show two versions of the packaged module of the presently preferred embodiment.
Figure 1B:
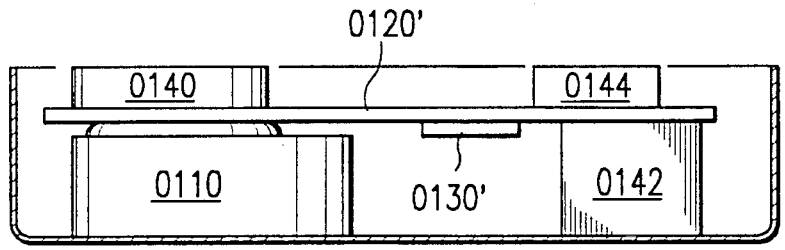

FIGS. 1A and 1B show the relation of assembled elements, in two versions of the packaged module of the presently preferred embodiment. (FIG. 1A shows a version using a packaged integrated circuit on a flexible circuit board, and FIG. 1B shows a version using a chip-on-board mounting with a rigid circuit board.) Note that the module shown includes an integrated circuit and a battery. The module is preferably coin-shaped, and the two faces of the module are isolated from each other.

To fit the integrated circuit into this very small space, an innovative packaging scheme is used in the preferred embodiment. A two-part metal container is used, which has two shallow concave pieces 0100A and 0100B which fit together. The integrated circuit (in a low-height package 0130, such as a flat-pack or SOIC) is mounted on a very small flexible printed circuit board 0120, which fits inside the container 0100. Laterally spaced from the integrated circuit 0130, on the other end of the small flexible board 0120, the board end is sandwiched between a battery 0110 and a piece of elastic conductive material 0140 (such as conductive plastic foam). Thus, the battery 0110 is connected between one face 0100B of the container 0100 and a power conductor (not shown) on the board 0120. The piece of elastic conductive material 0140 makes contact between a data trace (not shown) on the board 0120 and the other face 0100A of the container 0100. Another trace (not shown) on the board 0120 makes contact directly to the container face 0100B on which the battery's ground terminal is connected. Thus, simple wiring on the small board 0120, using through-hole vias, suffices to route power, ground, and data lines to the integrated circuit 0130, while providing a sealed durable package with two external contacts.

In the alternative embodiment of FIG. 1B, a small rigid circuit board 0120' is used in place of the flexible board 0120. Note that an additional piece of conductive foam 0142 is used in this case, to provide electrical contact from a trace on the board 0120' to the ground side 0100B of the casing. Note also that, optionally, an insulating additional piece of foam 0142 provides spacing between the board 0120' and the casing piece 0100A. Note also that a chip-on board mounting 0130' is used instead of the package 0130.

The casing halves 0100A/100B are preferably parts of a standard electronic battery package. Such a casing can be hermetically closed, simply by swaging the two parts together with sealant at their join. In the presently preferred embodiment, the casing 0100 has external finished dimensions (after the case is sealed) of 16 mm wide and 3.2 mm thick, and the battery 0110 is battery type AG1. However, of course, a wide variety of other dimensions and battery types can be used, as long as the dimensions are compatible.

The battery is preferably a low-voltage battery (1.5 V, in the preferred embodiment.) This is cheaper, and maximizes power efficiency, but requires some innovative circuit design features to accommodate the electrical interface. (Electronic watches have often been powered by 1.5 V batteries, but such devices do not have any direct electrical interface to the outside world. By contrast, the module of the presently preferred embodiment communicates over a one-wire bus which is driven by full CMOS voltage levels.)

The integrated circuit, in the preferred embodiment, contains 256 bits of serial-access memory. This memory is read- or write-accessed as a single block transfer. It is contemplated that larger amounts of memory may be advantageous. Of course, other types of memory organization can be used instead; but for many applications it is contemplated that use of a very small amount of memory (4K or less) may be particularly advantageous, since this extends the battery lifetime.

Module Mounting and Adhesion

In many applications (such as inventory control, machinery maintenance records, or retail tagging) users will prefer to affix the tokens to the physical items to which the data in the individual tokens refers. In this case, the token must be mounted so that both terminals of the token can be contacted by the user. In the presently preferred embodiment (using a package like that shown in FIG. 1A), only one of the possible orientations will work. (The inner casing piece 0100A must be exposed, and therefore, if the token is to be mounted on a surface, it is the outer casing piece 0100B which should be adhered to the surface.)

For such applications, the packaged modules (in embodiments using packages like those of FIGS. 1A and 1B) are preferably shipped with double-sided adhesive tape already affixed to the side of the module which is to be adhered to a surface (face 0100B, in the example of FIG. 1B).

Preferably the double-sided tape has a high-tack face adhered to the casing piece 0100B. The other side of the tape may be high-tack, for permanent mounting; or may be low-tack, for applications (such as retail) where the tokens will be frequently reused; or may be medium-tack. For many applications, the tokens can be advantageously shipped with the low-tack face of many tokens stuck to a common cover sheet.

Integrated Circuit Organization

Figure 6:
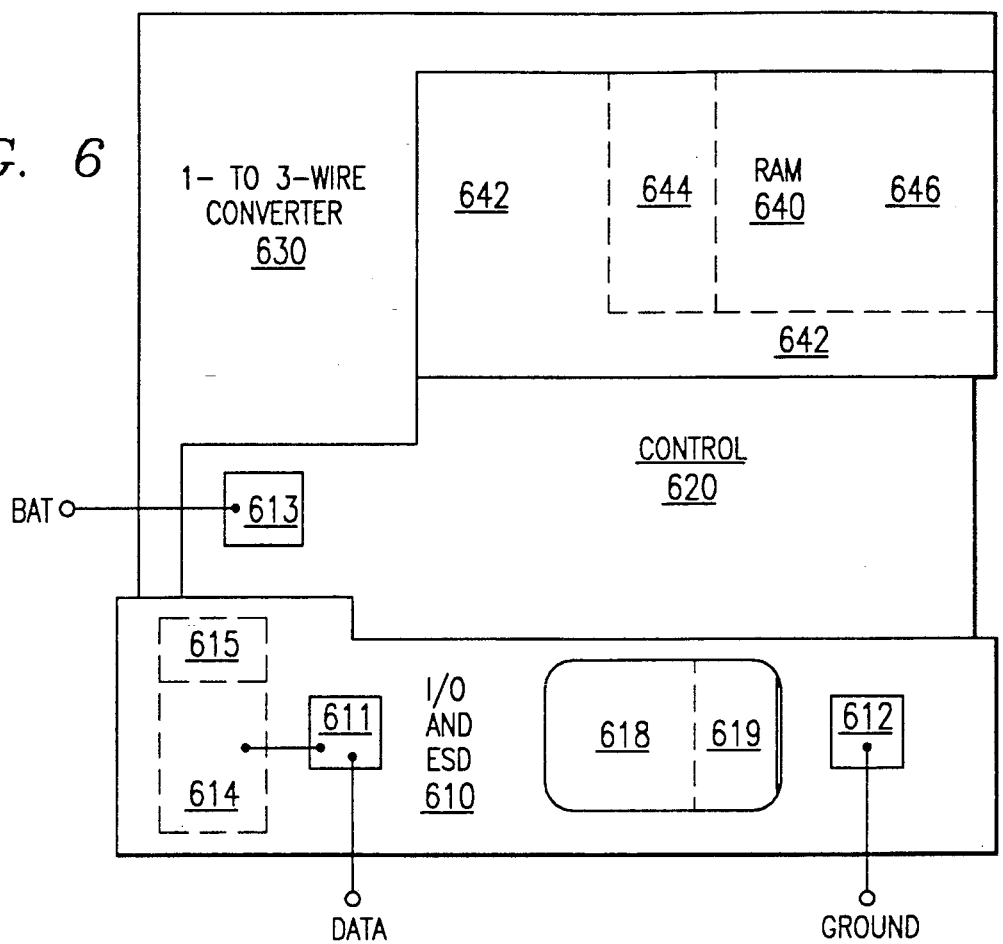
FIG. 6 is an overview of the physical organization of the intergated circuit which is used, in the presently preferred embodiment, in the module of FIG. 1.
Figures 1, 16A:
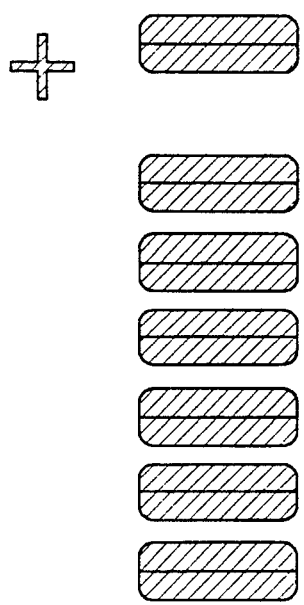

FIG. 6 is an overview of the physical organization of the integrated circuit which is used, in the presently preferred embodiment, in the module of FIG. 1. This is a fairly small integrated circuit, with a die size, in the preferred embodiment, of about 2,000 mil$^2$ (in 1.2 micron technology).

The incoming ground line is connected to a contact pad 612, and the incoming data line is connected to a contact pad 611, in an area 610 which contains I/O and ESD circuitry. (The battery terminal is connected to a third contact pad 613.) The contact pad 611 is connected to a large pull-down transistor 614, and to an ESD protection structure 618/619, which will be described in detail below. A very weak transistor 615, which is connected to be always turned on, is connected in parallel with the driver transistor 614, to provide a high-impedance leakage path which brings the two terminals of the module toward the same potential when the module is not connected to a system.

The incoming data interface is provided by 1-wire-to-3-wire conversion circuitry 630, which implements the one-wire bus protocol. This conversion circuitry connects to the memory 640, and to the control logic 620, through a more conventional three-wire bus (including data, clock, and reset lines).

The memory 640 is internally configured as a random-access memory array (although the host can only access the memory serially, as a single block). The memory includes peripheral logic 642, and two array portions. The overall array dimensions, in the preferred embodiment, are 16 rows by 16 columns, but two rows (shown as area 644) are preferably formed of RAM/ROM hybrid cells, which will be described below. The cells in the other 14 rows (shown as area 646) are conventional six-transistor SRAM cells.

Of course, a wide variety of other array sizes and layouts can also be used, as will be obvious to those skilled in the art of memory design. In fact, it is contemplated that, in the near future, the memory array size may be advantageously increased from 256 bits to 1024 bits.

Figure 7:
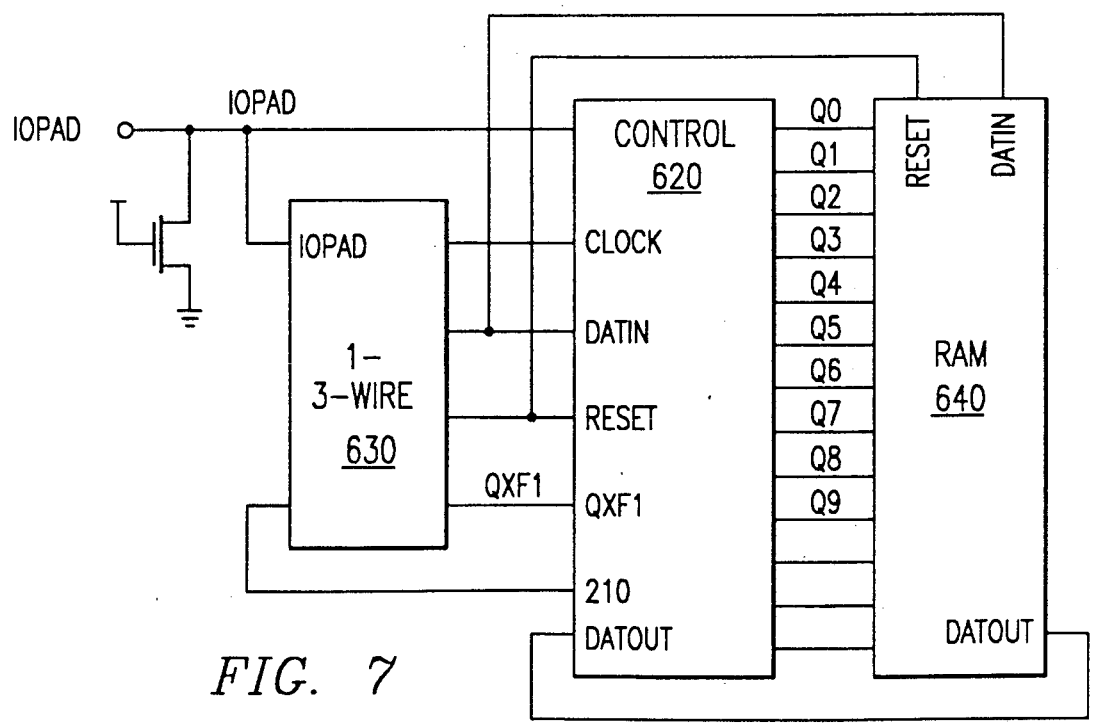
FIG. 7 shows the electrical organization of the integrated circuit of FIG. 6.

FIG. 7 shows the electrical organization of the integrated circuit of FIG. 6. The RAM 640 receives ten address bits Q0–Q9 from the control logic 620, as well as control signals ER2, SDOUTB, and RESET. Control signal ER2 enables the RAM. Control signal EWD selects read or write mode. Control signal SDOUTB is a strobe signal, which latches a data state for output. The RAM 640 also receives a data input DATIN, and can provide a data output DATOUT.

The 1-wire-to-3-wire conversion circuitry 630, in the preferred embodiment, interfaces from the external data line to a more conventional 3-wire serial bus, which includes RESET, CLOCK, and two data lines (DATIN and DATOUT). The control logic 620 also provides an output "210", which indicates when the counter is frozen. (This signal is used in implementing the reset logic, as discussed below.) The 1-wire-to-3-wire conversion circuitry 630 provides a timing output QXF1, which corresponds to the output pulse of a one-shot. (This pulse may be from 15 to 60 microseconds wide, and provides the basic timing reference inside the token module.)

Figure 8A:
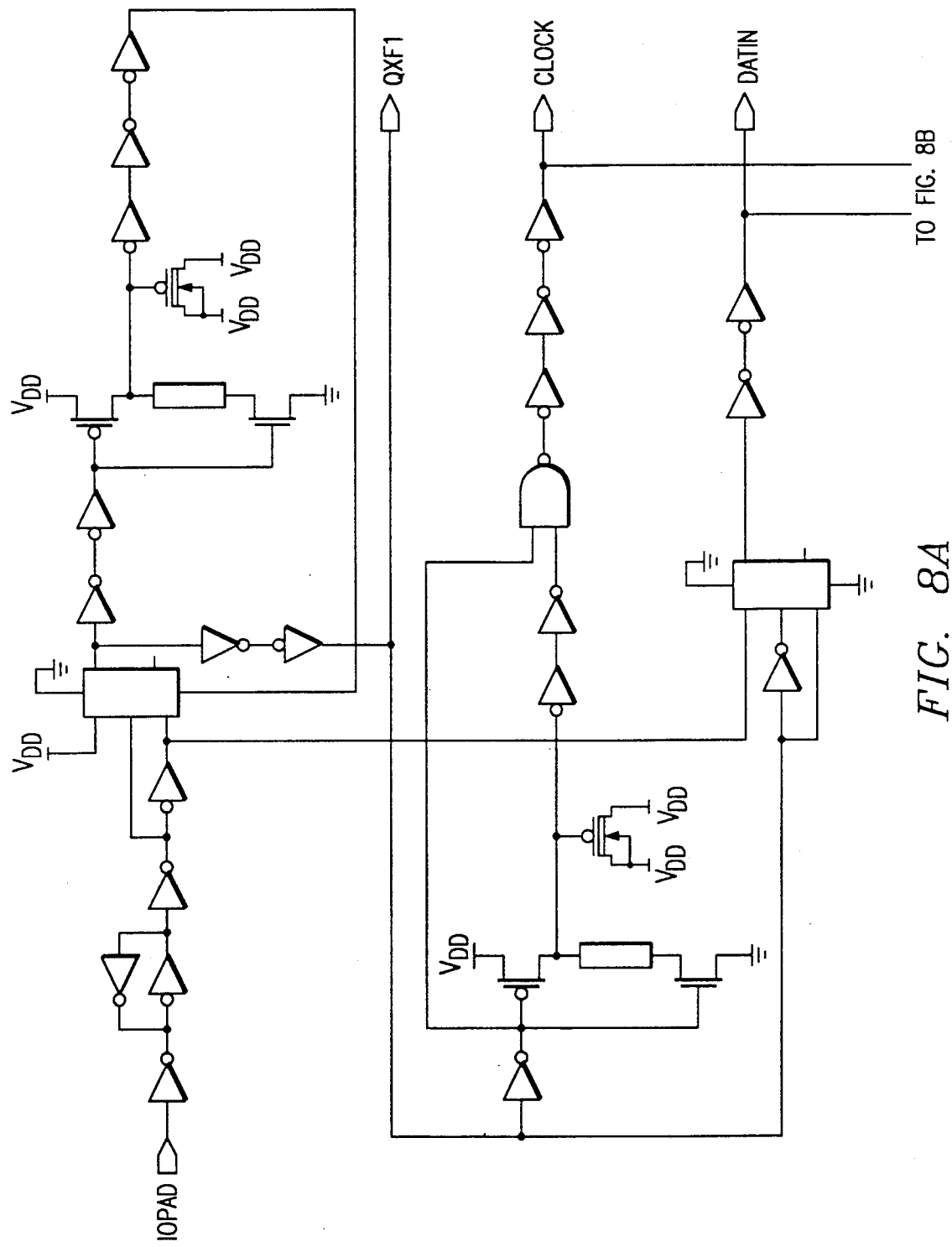
FIGS. 8A and 8B are two parts of a single Figure which shows the one-wire-to-three-wire conversion circuit used, in the presently preferred embodiment, in the integrated circuit of FIG. 6.
Figure 8B:
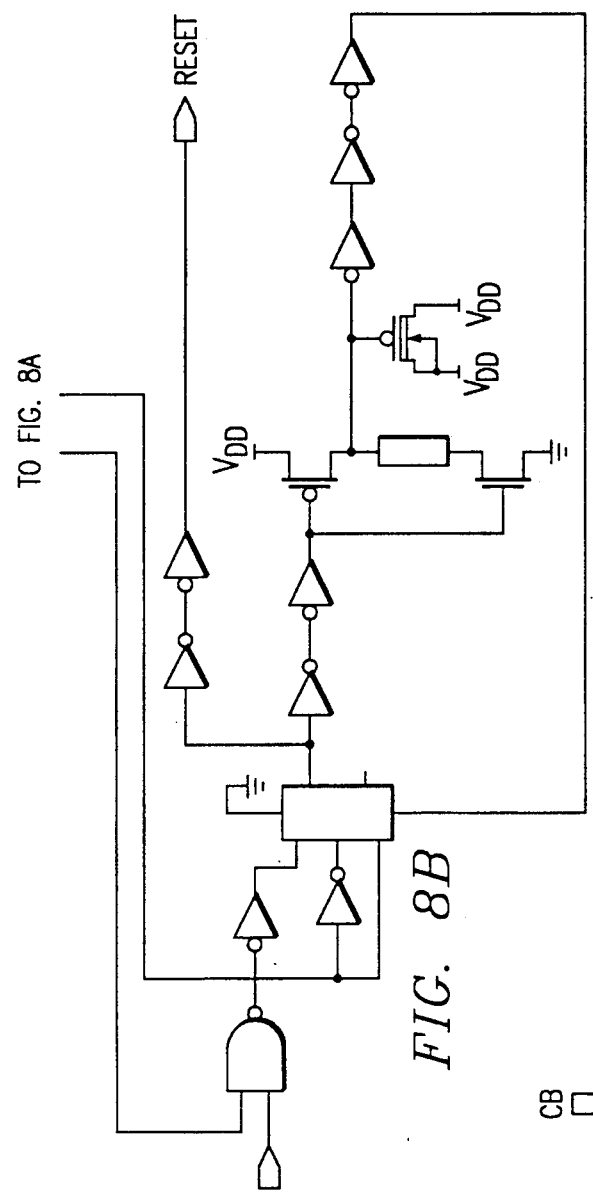

FIGS. 8A and 8B are two parts of a single Figure which shows the 1-wire-to-3-wire conversion circuitry 630 which is used, in the presently preferred embodiment, in the integrated circuit of FIG. 6. Every falling edge in the incoming data line fires a one-shot to produce a pulse on the line QXF1. (This pulse, in the presently preferred embodiment, has a width of 15-60 microseconds, and provides the time reference within the module.) In turn, every falling edge of signal QXF1 generates a short pulse (about 1.5 microseconds wide) on the CLOCK line. RESET signals are generated by simple logic which implements the conditions for reset, as described below.

Figure 9A:
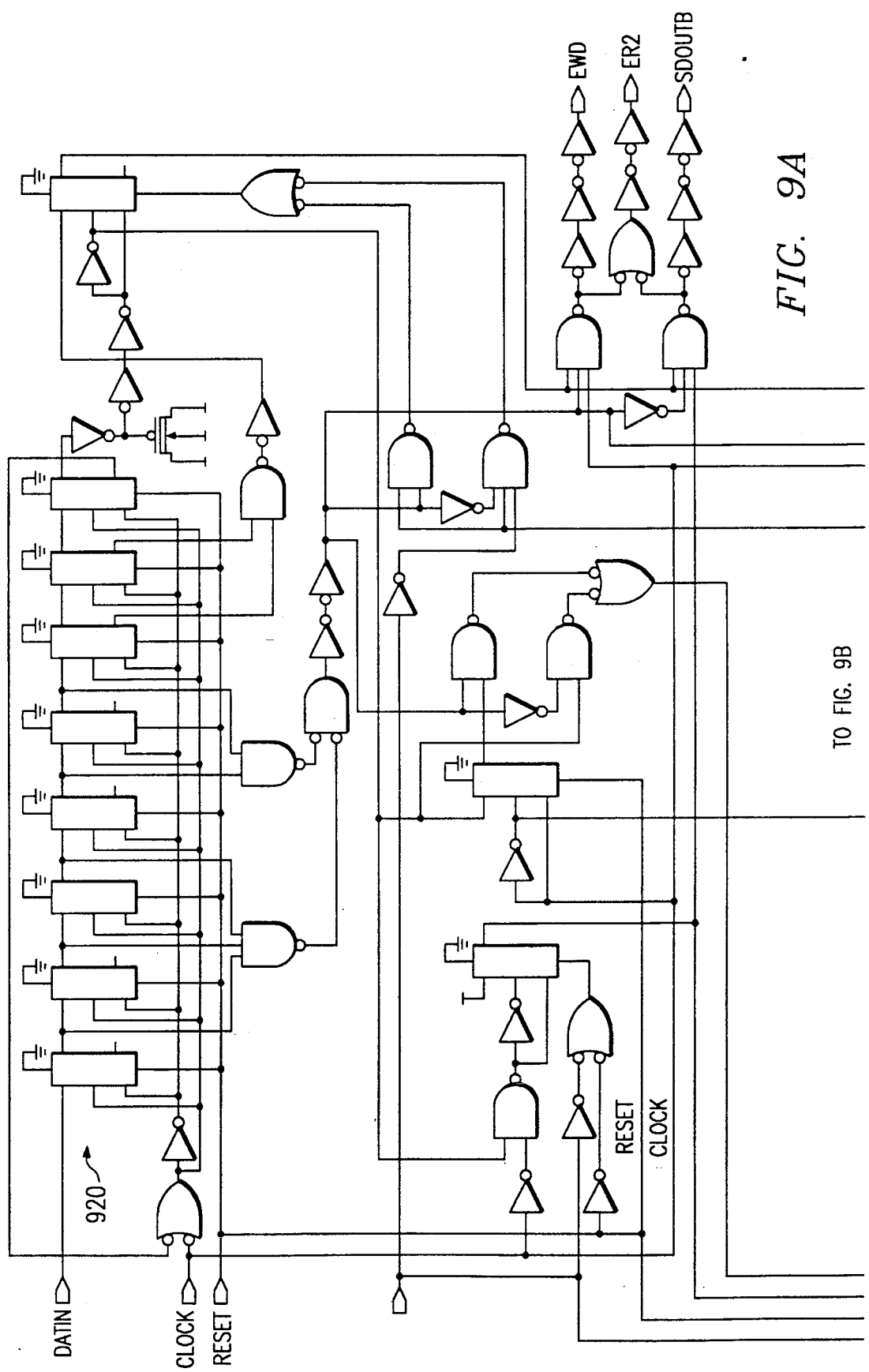
FIGS 9A and 9B are two parts of a single Figure which shows the control logic used, in the presently preferred embodiment, in the integrated circuit of FIG. 6.
Figure 9B:
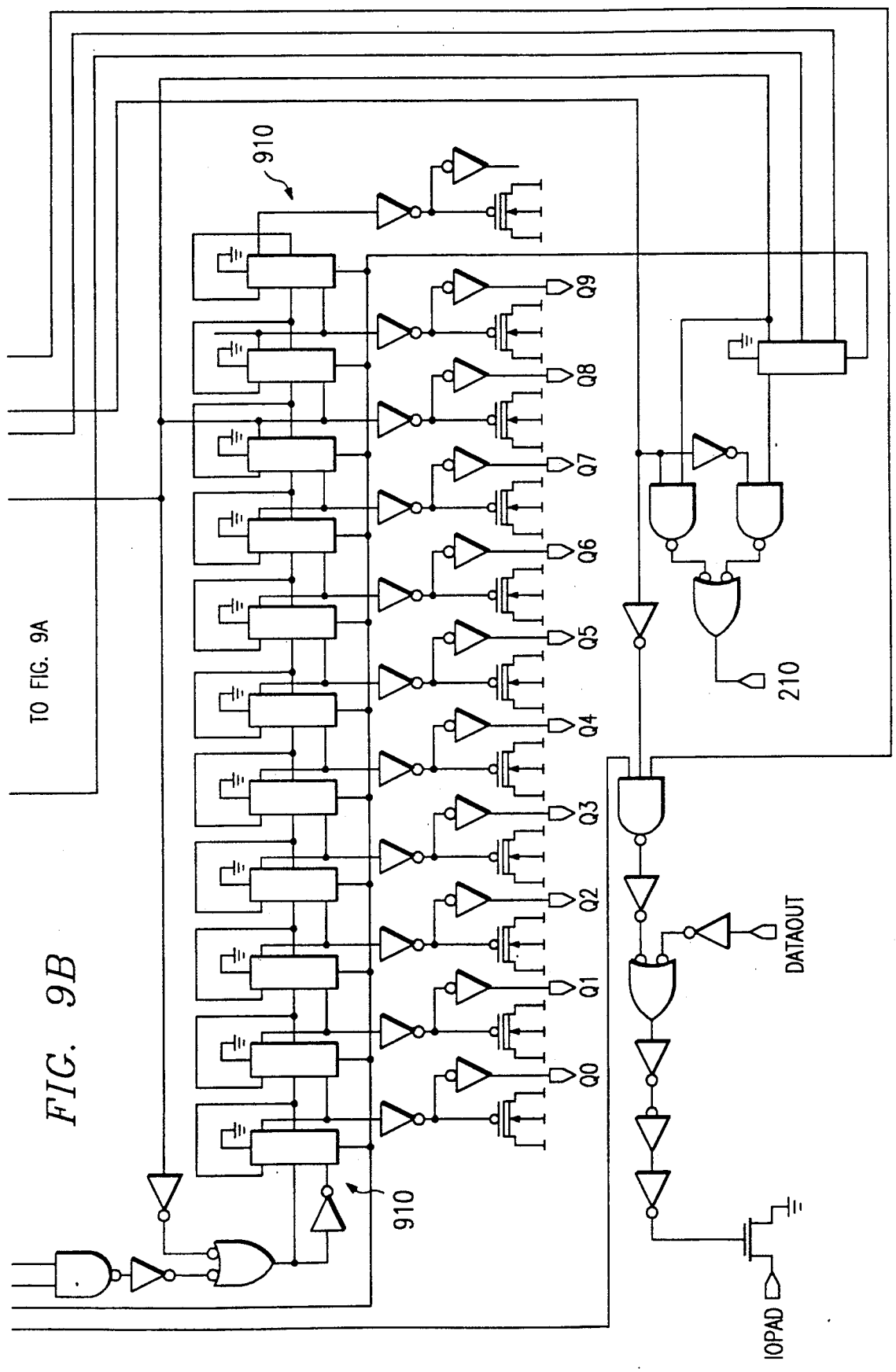

FIGS. 9A and 9B are two parts of a single Figure which shows the control logic used, in the presently preferred embodiment, in the integrated circuit of FIG. 6. After the protocol register 920 has been loaded, counter chain 910 counts successive clock pulses. (Every falling edge on the data line will lead to a clock pulse within the module, and these pulses are counted by counter 920.) The counter 910 is also connected to logic which will intercept the clock signal (to freeze the count), and activate signal 210, as soon as 256 bits of data have been read or written. (Note that the counter chain shown actually includes two more stages than are needed. This permits ready modification for 1024-bit embodiments.) Register 920 receives the protocol word. The stages of this register are connected so that a RESET will set the first stage, and clear the other stages. Thus, when a 1 propagates through to the last stage, a protocol word has been loaded.

Figures 2, 16A:
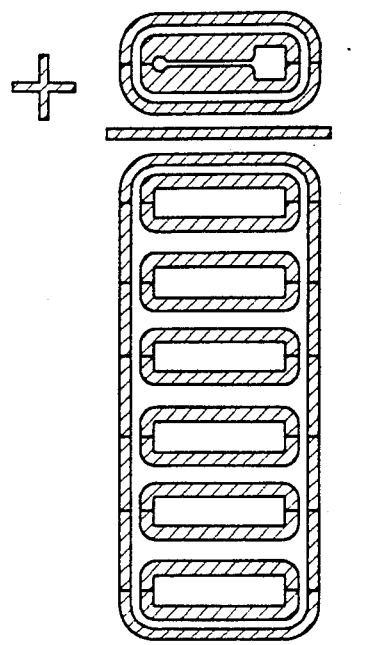
Figures 3, 16A:
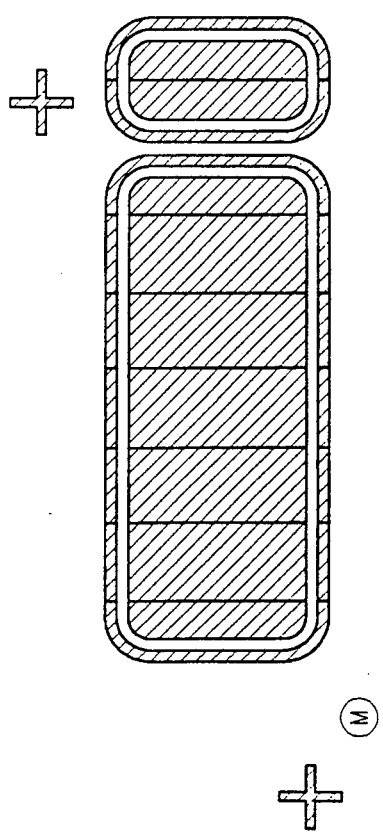
Figures 4, 16A:
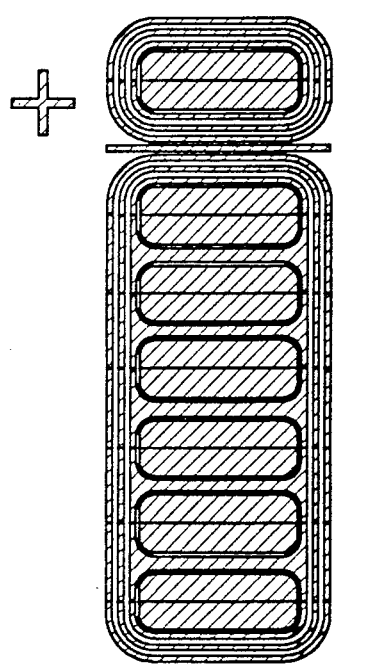
Figures 6, 16A:
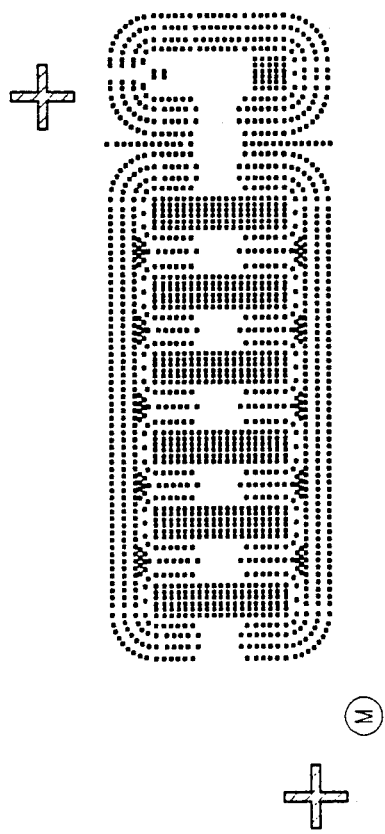

FIG. 4 shows the format of the protocol word, in the module of the presently preferred embodiment. Note that the first bit of the protocol word is always a 1. Note also that two bits have been reserved for module identification. Thus, memory expansion can be easily achieved by wiring as many as four memory chips in parallel, in a single token module. Note also that the read/write selection bits provide significant protection against accidental writes, in a high-noise environment.

Low-Voltage SRAM Architecture

Among the innovative teachings set forth in the present application is a low-power low-voltage CMOS six-transistor static random access memory (SRAM), which can operate on a power supply voltage which is less than the sum of the NMOS and PMOS threshold voltages, and which does not include any analog or metastable sense amplifier stages. The selected cell is allowed to pull one of its bitline pair all the way down to ground. Thus, full logic levels appear on the bitline pair. Only one line of the bitline pair is connected to the following gate stage. Preferably bitline precharge transistors are connected to pull up all bitline pairs whenever the RAM is not selected.

Process Characteristics

In applications such as those of the preferred system embodiment, it is highly desirable to minimize unnecessary charge consumption. In particular, this means that the area-specific junction leakage of the semiconductor material, for the source/drain junctions, at 5 Volts and at 25 C, should be low (preferably much less than 1 femtoAmperes per square micron). For example, the process used in the presently preferred embodiment has junction leakage, for the source/drain junctions, in the neighborhood of about 100-200 attoAmperes per square micron at 25 C and at 5 Volts. (As is well known, this parameter has a strong temperature dependence. For example, the process used in the presently preferred embodiment has junction leakage, for the source/drain junctions, in the neighborhood of a few femtoAmperes per square micron at 25 C and at 5 Volts.) Such low leakage is achieved, as is well known to those in the semiconductor art, by using good quality monocrystalline silicon starting material with low levels of carbon and transition metals; optionally, growing epitaxial silicon on the starting wafers; rigorously isolating wafers in process from heavy metal contamination; minimizing the exposure of wafers in process to ionizing radiation, from sources such as implanters; and other such well-known precautions.

Electrical Organization

Figure 10:
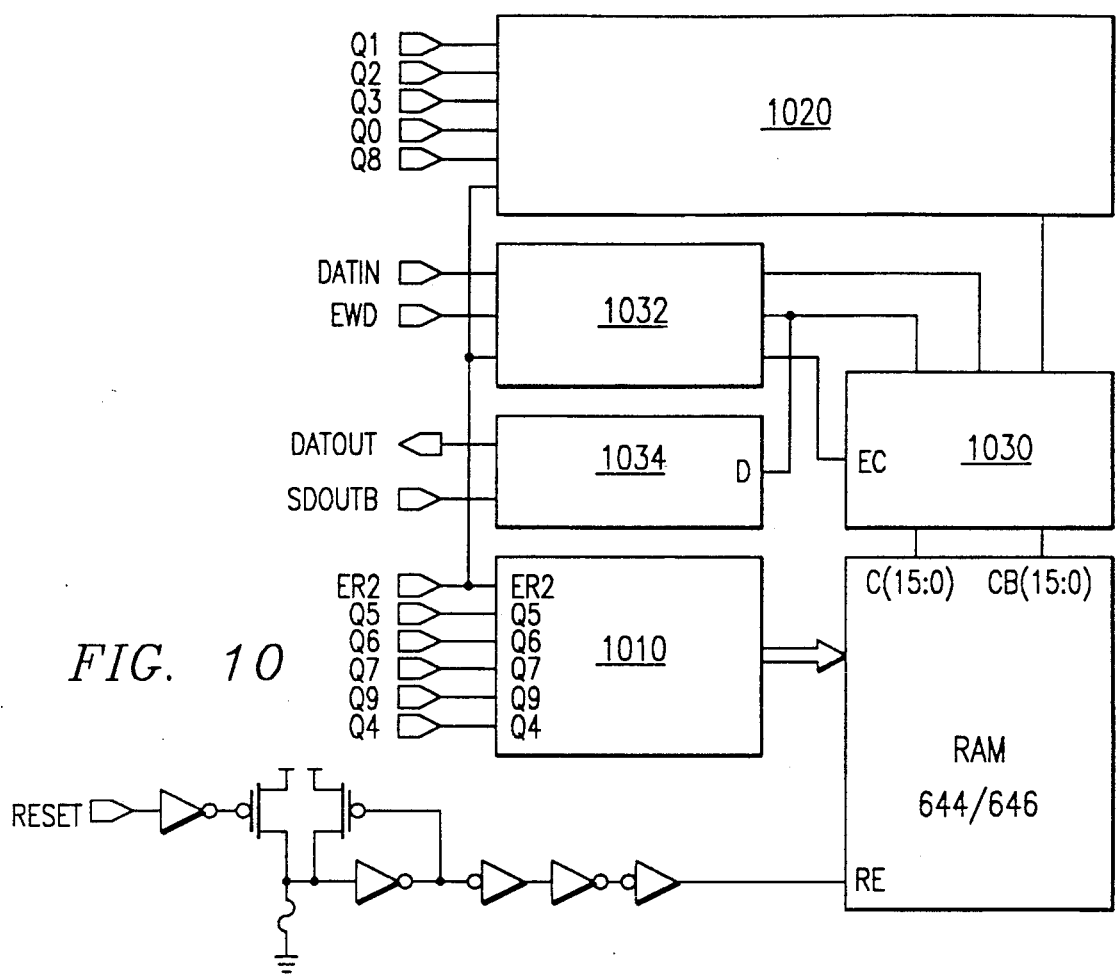
FIG. 10 shows the electrical organization of the memory, in the presently perferred embodiment, in the integrated circuit of FIG. 6.

FIG. 10 shows the electrical organization of the RAM 640, in the presently preferred embodiment, in the integrated circuit of FIG. 6. Five address bits are connected to row predecoder/decoder 1010, and five bits are connected to column predecoder/decoder 1020. (As noted above, it is contemplated that expansion to an array of 1024 bits may be advantageous, and the extra address bits are provided for this contingency.) The eight primary address bits provide 16 select lines, to the 16 parallel blocks of column driver logic 1030, to select a column. The column driver logic contains precharge transistors, and also contains pass gates which connect the selected column to a write driver circuit 1032 (in write mode) or to sense amplifier 1034 (in read mode).

Precharge Operation

The column lines (bitline pairs) are always held high when the memory is deselected. When the memory is selected, the bitline pairs are floated (until a row of cells turns on, and begins to pull down one side of each bitline pair). This always-high operation helps to provide power efficiency: one-half of the bitlines are discharged for each one-bit data access, but not under any other circumstance. Thus, the net charge consumption per access is acceptably low.

Sense Amplification and Output

The "sense amplifier" circuit 1034 does not function at all similarly to a conventional memory sense amplifier: this amplifier is a simple digital circuit, which receives a single-ended output, from only one of the bitlines in a bitline pair. (However, the write driver is double-ended, since one of the bitlines must be driven low.)

Figure 14:
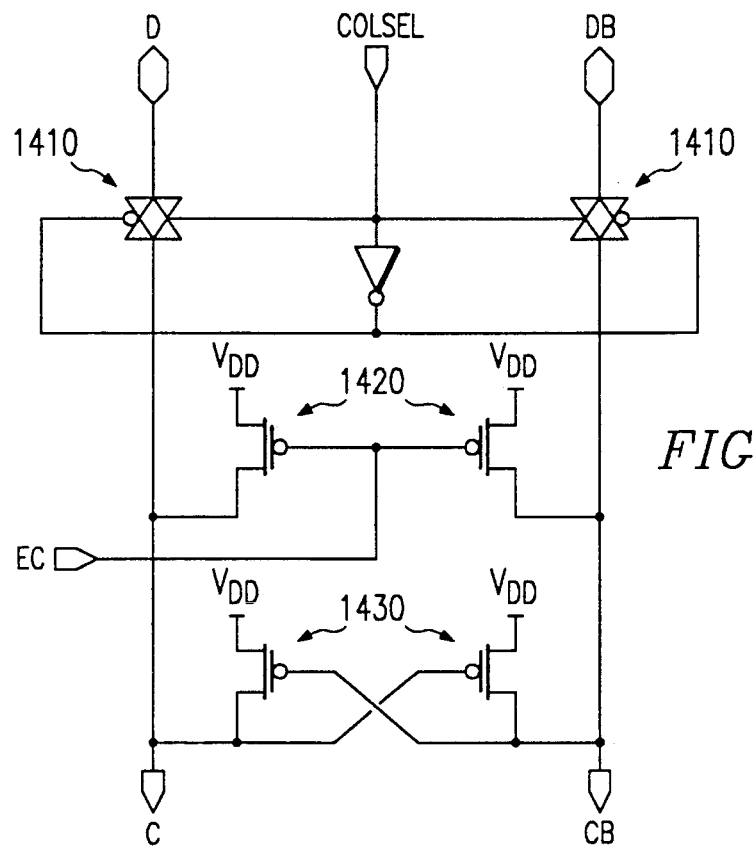
FIG. 14 shows the bitline precharge and pull-up logic used in the memory of FIG. 10, in the presently preferred embodiment.

FIG. 14 shows the bitline precharge and pull-up logic used for each column of the memory of FIG. 10, in the presently preferred embodiment. Note that full CMOS transmission gates are used to pass the output of the selected column. (This is required by the low operating voltage permitted in the presently preferred embodiment.) PMOS transistors 1420, when gated by signal EC, precharge the bitline pair C and CB to $V_{DD}$. When a selected cell begins to pull down one side of the bitline pair (either line C or line CB), one of the cross-coupled PMOS transistors 1430 will turn on (after the line sinks below $V_{DD}-V_{TP}$) to hold the other side of the bitline high. (Since the bitline was already precharged high, this transistor is not expected to source large amounts of current. These transistors are provided primarily to avoid the risk of a floating node.)

Figure 13:
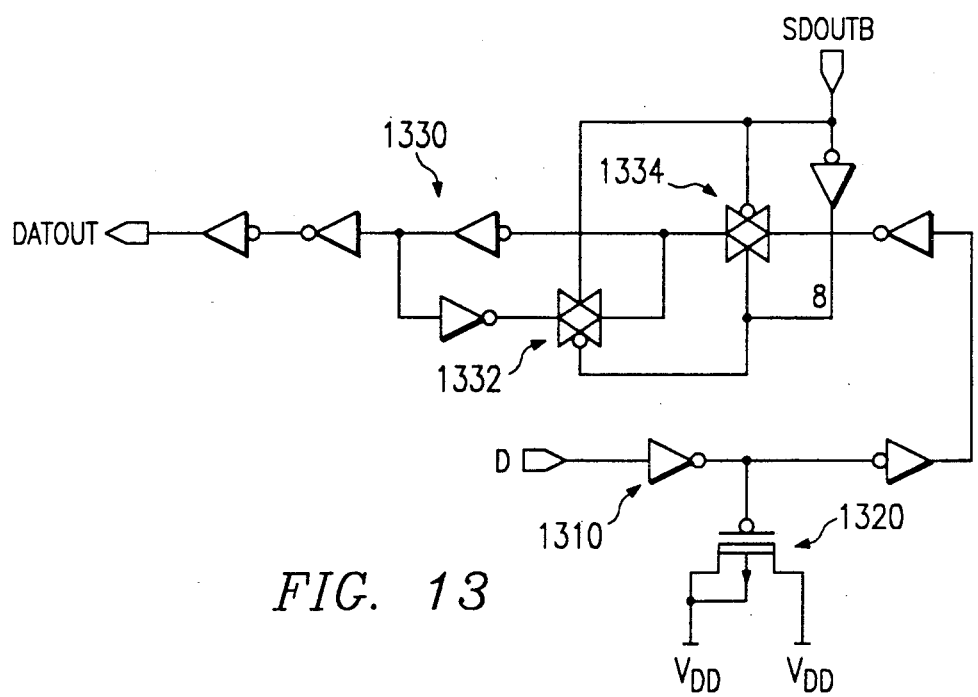
FIG. 13 shows the single-ended sense amplification stage used in the memory of FIG. 10, in the presently preferred embodiment.

FIG. 13 shows the single-ended sense amplification stage used in the memory of FIG. 10, in the presently preferred embodiment. The input labelled D is one side of a column bitline pair C and CB, selected by one of the selection gates shown in FIG. 14. Note that the first stage inverter 1310 is preferably asymmetric. In the presently preferred embodiment, this inverter includes a PMOS device which is 30 microns wide and 1.2 microns long, and an NMOS device which is 3 microns wide and 3 microns. This asymmetry helps to assure that inverter 1310 will switch strongly as soon as it receives a signal from a bitline which is being pulled down by the driver transistor in a cell. (In a normal CMOS circuit, this asymmetry would shift the trip point of the logic stage. However, in this low-voltage logic, this is not true, due to the hysteresis effect discussed above with reference to FIGS. 5A and 5B.) The output of inverter 1310 is loaded by capacitor 1320. This capacitive loading helps to provide data hold time after signal SDOUTB ends. The following inverters, in the preferred embodiment, have more normal relative device sizings (nominal W/L: PMOS 10/1.2, NMOS 5/1.2). The resulting logical signal is fed into a gated latch 1330, which is clocked by signal SDOUTB. Note that the latch is clocked in two places, so that the feedback connection is broken (by full CMOS transmission gate 1332) whenever full CMOS transmission gate 1334 turns on to admit a new data value. This prevents contention and saves power.

RAM/ROM Hybrid Memory

Another innovative teaching set forth in the present application is a memory cell which can operate as a static RAM, or can be programmed to operate as a ROM cell. Thus users who need the extra security permitted by ROM encoding can can have this capability, while users who do not need ROM encoding can use off-the-shelf parts as RAM only.

Figure 11:
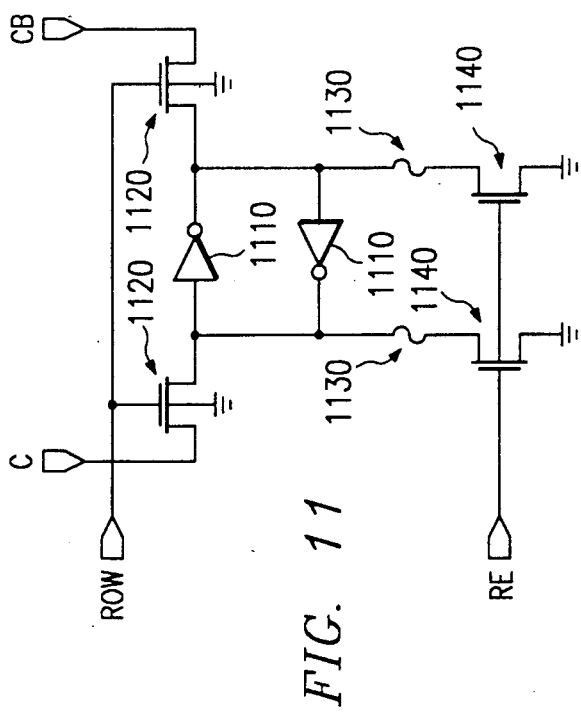
FIG. 11 shows an innovative memory cell, which can operate as a RAM cell, or which can be programmed to operate as a ROM cell.

FIG. 11 shows an innovative memory cell, which can operate as a RAM cell, or which can be programmed to operate as a ROM cell. The signal RE is itself derived from a fuse, and, if ROM operation has not been enabled, this signal will be low. Thus, in RAM mode, the cross-coupled inverters 1110 will provide normal latch operation, selectively accessed by pass transistors 1120.

When it is desired to convert a block of memory to ROM, a fuse is blown to hold the RE signal high. In addition, one of the two fuses 1130 is blown in each cell, to encode either a "1" or "0". Thereafter, one of the two nodes of the latch will always be pulled to ground. Even if the cell is addressed in a write operation, the connection to ground will easily overpower the PMOS load transistor, to hold the latch in its permanently programmed state. (In the presently preferred embodiment, the NMOS driver transistors in the inverters 1110 each have nominal W/L dimensions of 8/1.2 microns, the PMOS load transistors in the inverters 1110 each have nominal W/L dimensions of 6/6 microns, and the NMOS ROM-mode transistors 1140 and the NMOS pass transistors 1120 each have nominal W/L dimensions of 4/1.2 microns.)

ESD Protection

The systems environment described above means that the data modules face some unusual integrity requirements. Since the modules may be exposed to very rough treatment, in consumer and industrial environments, they should preferably have a very high level of immunity to electrostatic discharge (ESD).

ESD Protection Diode Profile

Figures 8, 16A:
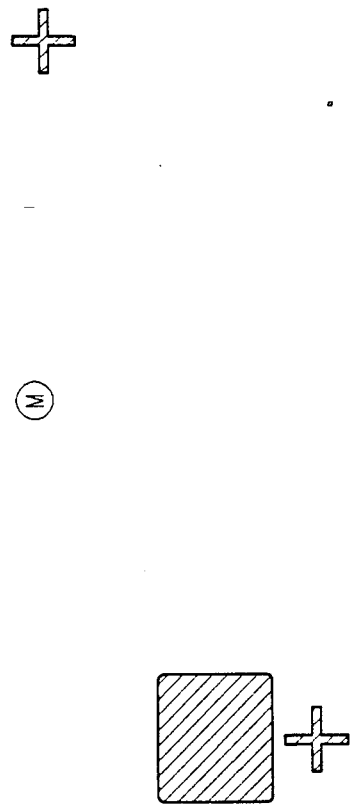
Figures 5, 16A:
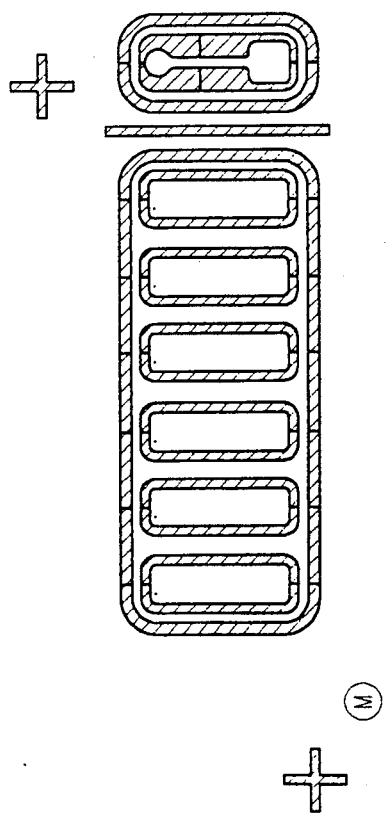
Figures 7, 16A:
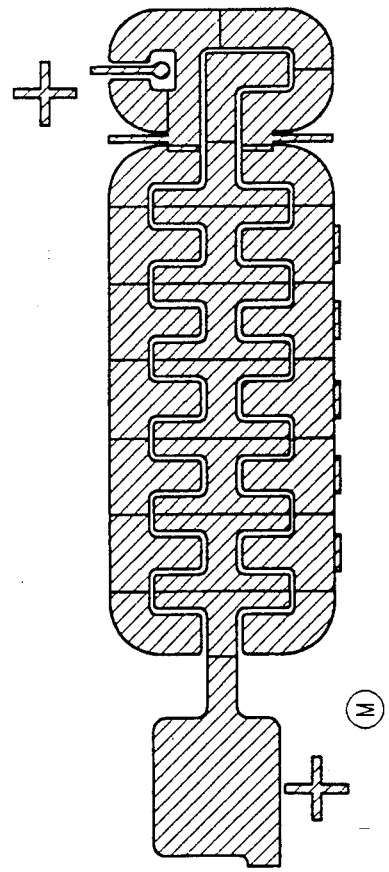
Figure 16B:
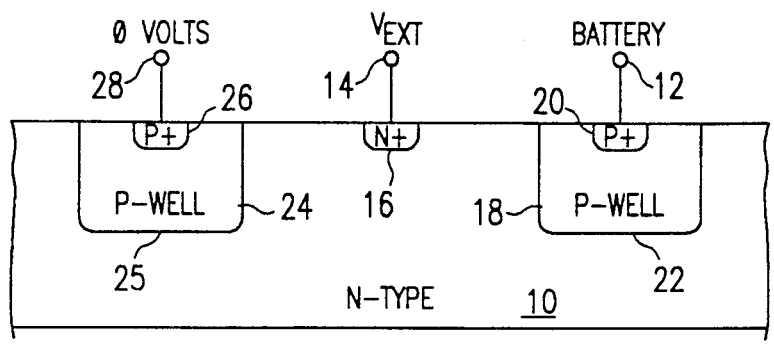
FIG. 16B illustrates a cross-sectional diagram of a prior art battery protection circuit.

Referring now to FIG. 16B, there is illustrated a cross-sectional diagram of a semiconductor substrate 10 utilizing a prior art battery protection device. In this type of device, a battery terminal 12 is provided for being connected to a battery (not shown) and an external voltage terminal 14 is provided for being connected to an external (system) supply voltage $V_{EXT}$. The battery terminal 12 is typically at a lower voltage than the external supply voltage $V_{EXT}$. For example, the battery voltage for most battery-backed systems is typically around three volts, whereas the external voltage $V_{EXT}$ is typically around five volts.

The external supply terminal 14 is connected to the substrate 10, which is an N-type semiconductor substrate in this example, through an n+ contact region 16. The battery terminal 12 is connected to a P-well 18 through a p+ contact region 20. The boundary of the P-well 18 forms a PN junction 22. Therefore, when the N-type substrate 10 is at a lower potential than the battery terminal 12, current will flow through the forward biased PN junction 22 from the battery terminal 12. However, when the external supply terminal 14 is a higher voltage than the battery terminal 12, the PN junction 22 is reverse biased and blocks current. This essentially prevents current flowing from the external terminal 14 to the battery terminal 12 and thus charging the battery.

In a typical CMOS semiconductor device utilizing P-wells and N-wells in a twin-tub process, there will be additional P-wells that are separated from the P-well 18. One of these is represented by a P-well 24, which is disposed in the N-type substrate 10 and separated from the P-well 18 by a predetermined minimum spacing in the N-type substrate 10. A PN junction 25 is formed between the N-type substrate 10 and the P-well 24. The P-well 24 can be utilized to configure any type of device. In order to contact the P-well 24, a p+ contact 26 is provided which is connected to an external circuit terminal 28. It should be understood that the illustrated structure merely represents a partial example of such a P-well structure. (For example, such a P-well would usually include at least two shallow N+ diffusions, to provide the source/drain regions of an MOS transistor. Such a P-well may contain three or more such N+ diffusions, to provide more than one transistor, and may also be configured to provide other elements as well, e.g. diodes or capacitors).

Figure 16C:
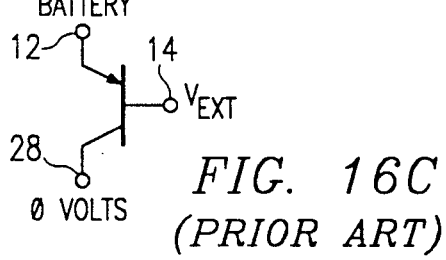
FIG. 16C illustrates a schematic diagram of the parasitic PNP transistor in the prior art structure of FIG. 16B.

A problem arises with the prior art device whenever the external voltage falls (e.g. when the terminal 14 is disconnected from $V_{EXT}$, or the system power supply fails), so that the external circuit terminal 28 is connected to a voltage lower than the battery terminal. In the structure shown in FIG. 16B, this will reverse bias the PN junction 25. In this mode, minority carriers (holes, in this example) which are injected into the substrate 10 at the forward biased PN junction 22 can be collected at the PN junction 25. This results in the formation of a leaky parasitic PNP transistor. This parasitic PNP transistor is illustrated in FIG. 16C. This transport of holes creates a net current, from the battery terminal 12 to the ground terminal 28, which dissipates power.

The parasitic transistor of FIG. 16C has the emitter junction formed between the P-well 18 and the N-type substrate 10 with the battery terminal 12 providing the emitter terminal. The base is formed by the N-type substrate 10 with the base terminal comprising the external voltage terminal 14. The collector junction is formed between the P-well 24 and the N-type substrate 10 with the external circuit terminal 28 representing the collector terminal. It can be seen that whenever the external voltage terminal 14 is disconnected, the parasitic transistor illustrated in FIG. 16C passes leakage current. This results in leakage current, which, in a relatively low power device, can comprise a significant portion of the supply current, since there are usually a number of adjacent P-wells on the substrate with a parasitic transistor connected to each of the adjacent P-wells. Since the bases of all of these transistors will be common, this effectively forms a multi-collector parasitic transistor.

FIG. 2 and 8 show two important embodiments of the disclosed innovative diode structure. In each, the battery power input is connected through a first junction 111, so that the battery cannot be charged when the external (system) power supply is active. The battery isolation diode junction 111 is surrounded by a second junction 112. In the embodiment of FIG. 16D, the first junction 111 is the boundary of P+ first region 36 and N-type second region 34, and the second junction 112 is the boundary of N-type second region 34 with P-type third region (P-well) 32. In the embodiment of FIG. 16K, the first junction 111 is the boundary of P-type first region 121 and N-type second region 122, and the second junction 112 is the boundary of P-type first region portion 121B with P-type third region 113. Note that, in FIG. 16D, the second region 34 encloses the first region 36, whereas, in the embodiment of FIG. 16I, the first region 121 encloses the second region 122.

The second junction 112 is preferably shorted out, by a wired connection which makes ohmic contact to the semiconductor regions on both sides of the junction. In the embodiment of FIG. 16D, the wiring 43 which shorts out the second junction makes ohmic contact to the second region 34 at N+ diffusion 40, and makes ohmic contact to the third region 32 at P+ diffusion 38, and is also ohmically connected to N-type extended region (substrate) 30 at N+ diffusion 42, and is also tied to external supply voltage $V_{EXT}$. In the embodiment of FIG. 16K, the wiring 131 which shorts out the second junction makes ohmic contact to the first region 121 at P+ diffusion 121A, and makes ohmic contact to the third region 113 at N+ diffusion 113A, and is also ohmically connected to the battery terminal $V_{BAT}$.

The built-in potential of second junction 112 provides efficient collection of minority carriers, which will recombine in the neighborhood of this junction. Thus, the second junction collects the minority carriers which can be generated when the first junction 111 is forward biased (i.e. when the integrated circuit is being powered from the battery). Otherwise, minority carriers could diffuse to other junctions, to cause leakage currents which can significantly degrade the lifetime of a low-powered device.

Note also that the structures of FIG. 16D and FIG. 16K both include an intermediate-depth diffusion, with a junction depth which is significantly deeper than the source/drain junction depth, but significantly shallower than the depth of the well. In the embodiment of FIG. 16D, this intermediate-depth diffusion is provided by the N-type second region 34. In the embodiment of FIG. 16K, this intermediate-depth diffusion is provided by the P-type first region portion 121A.

Referring now to FIG. 16D, there is illustrated a cross-sectional diagram of a preferred embodiment of the disclosed innovative battery protection circuit, as implemented in an N-type substrate 30. A P-well 32 is formed in the N-type substrate 30, having a depth of approximately four microns. An N-type region 34 is formed in the P-well 32 to a depth of approximately 0.8 microns. A p+ region 36 is formed within the N-type region 34. In this sample embodiment, the p+ region 36 has a thickness of approximately 0.40 microns. A p+ contact 38 is provided that surrounds or forms a ring around the N-type region 34 to provide a contact to the P-well 32. In a similar manner, an n+ contact 40 is provided that surrounds the p+ region 36 to provide contact from the surface to the N-type region 34. An n+ contact 42 is provided in the N-type substrate 30 outside the boundaries of the P-well 32. The external voltage terminal 14, having the voltage $V_{EXT}$ connected thereto, is interfaced with the n+ region 42. In a similar manner, the battery terminal 12 is interfaced with the p+ region 36. In addition, the external voltage terminal 14 is connected to the p+ region 38 and to the n+ region 40 through an interconnect line 43.

The P-well 24 and associated p+ region 26 and external circuit terminal 28 are also provided in the substrate 30 to illustrate the formation of the reverse biased PN junction 25. As will be described hereinbelow, the disclosed innovative battery protection circuit prevents conduction from the battery terminal 12 to the PN junction 25 when the PN junction 25 is reverse biased. For illustrative purposes, the external circuit terminal 28 is connected to a voltage lower than the battery terminal, for example, zero volts.

Figure 16E:
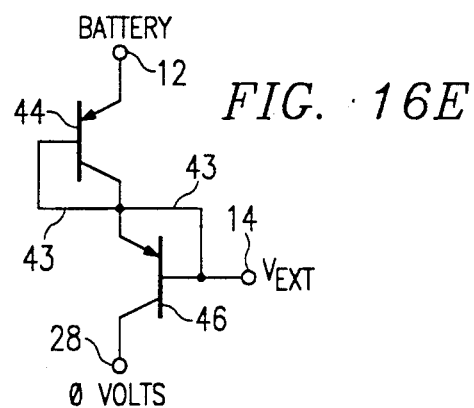
FIG. 16E illustrates an electrical schematic of the parasitic PNP transistors of the battery protection circuit of FIG. 16D.
Figure 16D:
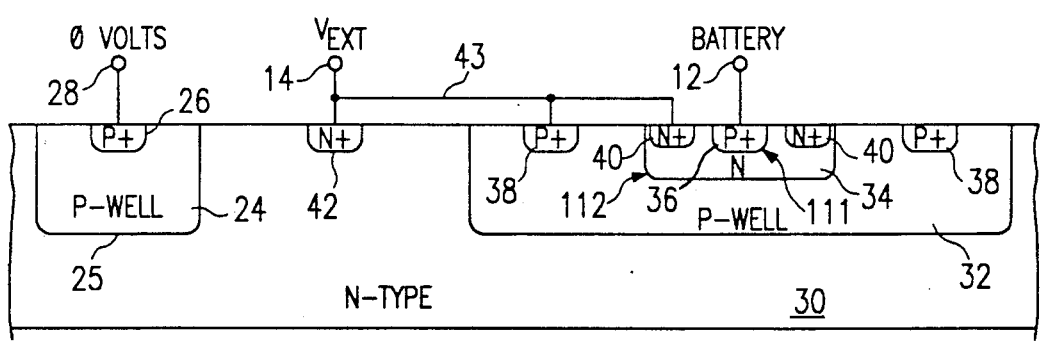
FIG. 16D illustrates a cross-sectional diagram of a first sample embodiment of the disclosed innovative battery protection circuit.

The parasitic transistors formed in the structure of FIG. 16D are illustrated in FIG. 16E. A first PNP transistor 44 is formed having the emitter thereof connected to the battery terminal 12, the base thereof connected to the collector thereof and the collector thereof connected to the emitter of a second PNP transistor 46. The second PNP transistor 46 has the base thereof connected to the external supply terminal 14 and also connected to the emitter thereof. The collector of the second PNP transistor 46 is connected to the external circuit terminal 28. The transistor 44 has the emitter thereof formed by the junction between the p+ region 36 and the N-type region 34, the base thereof formed by the N-type region 34 and the collector thereof formed by the junction between the N-type region 34 and the P-well 32. The transistor 46 has the emitter thereof formed by the junction between the P-well 32 and the N-type region 30, the base thereof formed by the N-type region 30 and the collector thereof formed by the junction between the N-type region 30 and the P-well 24.

In operation, the P-type transistor 44 has the base thereof connected to the collector, and thus, it is configured as a diode. This allows current to flow through the collector of transistor 44 when the battery terminal 12 is at a higher voltage than the N-type substrate 30. However, the emitter-to-base junction of transistor 46 is shorted, thereby inhibiting operation of the transistor 46. Therefore, when the external voltage terminal 14 is at a lower voltage than the battery terminal 12, there is no parasitic transistor operation that results in leakage from the battery terminal 12 to the P-well 24.

Referring further to FIGS. 2 and 3, conduction in the parasitic transistor of the prior art normally occurs as a result of minority carriers being injected into the N-type substrate 30 and being collected in the P-well 24. This collection is a result of the reverse biased PN junction 25. In order to prevent conduction in the parasitic transistor, it is necessary to prevent either injection of the minority carriers into the N-type substrate 30, or prevent subsequent collection thereof by the P-well 24. This, in effect, kills the gain of the parasitic transistor.

In the disclosed innovative battery protection circuit, the minority carriers exist in the N-type region 34 as holes. The P-well 32 is biased at the same potential as the N-region 34 and therefore acts as a collector for the minority carriers or holes. However, it should be understood that any barrier which prevents migration of minority carriers over to the PN junction 25 to allow collection there by the P-well 32 will produce the same result. For example, an insulating layer could be utilized that totally encloses the N-type region 34, which insulator would adequately prevent minority carrier injection. Further, the holes, which are collected in the P-well 32, could be recombined in a very heavily doped N-type region that was disposed around the N-region 34 in place of the P-well 32. This would effectively perform a recombination of the holes therein to prevent the holes from migrating into the N-type substrate 30. This heavily doped N-type region could also be disposed around the P-well 24.

With further reference to FIG. 16D, the P-well 32 is provided as a collector of minority carriers. The purpose of the electrical connection 43 is to provide a path for free electrons or majority carriers. The holes generated in the N-type region 34 as a result of the forward biased PN junction between p+ region 36 and N-type region 34 are recombined at the junction between the electrical connection 43 and the n+ region 40, thus preventing the minority carriers from flowing through electrical connection 43 to the N-type substrate 30. It is possible that this electrical connection 43 could be replaced by a conductive n++ plug that is disposed through the P-well 32 to the N-type substrate 30 to connect the N-region 34 and the N-type substrate 30. However, an electrical connection would still be required between the P-well 32 and the N-type region 34 to provide the correct bias therefore.

Although the just-described embodiments of the disclosed innovative battery protection circuit were described with respect to an N-type substrate and parasitic PNP transistors, it should be understood that the dual of this structure could provide the same result wherein the battery voltage were a negative voltage and the overall system operated on a negative voltage. For example, the battery diode protection circuit would now have an n+ region connected to the battery and a P-type region providing the other side of the diode. An N-well would be disposed therearound isolating the diode from a P-type substrate. The N-well would provide the minority carrier isolation and act as a collector therefore, the minority carriers being electrons in this case. This would prevent minority carriers from being collected in an adjacent N-well to form a leaky NPN transistor.

Figure 16G:
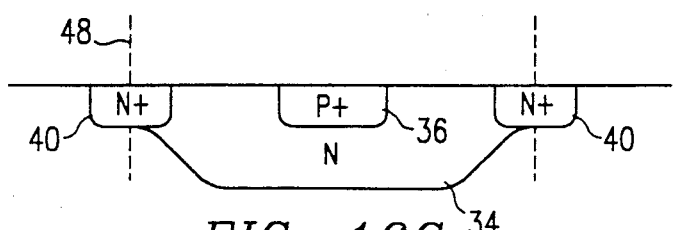
FIG. 16G illustrates a cross-section of a portion of the structure shown in FIG. 16D.
Figure 16F:
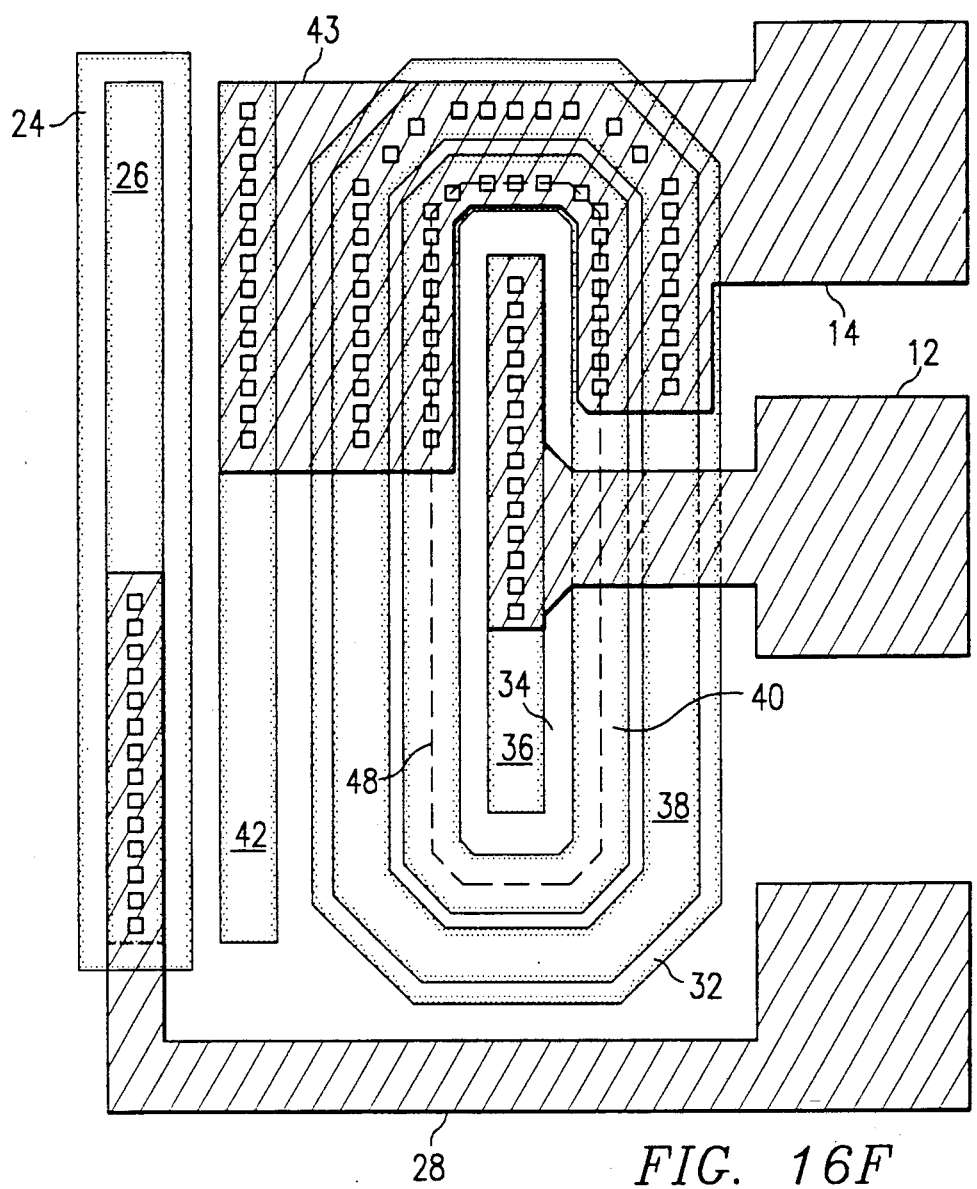
FIG. 16F illustrates a top view of the battery protection circuit of FIG. 16D.

Referring now to FIG. 16F, there is illustrated a top-level diagram of the structure of FIG. 16D. The p+ region 36 is formed as an elongated implant that is surrounded by the n+ region 40. The n+ region 40 is in turn surrounded by the p+ region 38. The N-type region 34 to which the n+ region 40 is connected, does not extend entirely under n+ region 40 to the exterior boundary thereof. Rather, the external boundary of the N-type region 34 is defined by a border 48. A detail of the N-type region 34 is illustrated in FIG. 16G. The P-well 32 is illustrated as surrounding the p+ region 38. The n+ region 42 is formed from an elongated implanted region that is disposed adjacent to the P-well 32. In a similar manner, the P-well 24 is also elongated and disposed adjacent the n+ region 42 with the p+ region 26 disposed within the P-well 24 and also having an elongated configuration.

In this embodiment, the disclosed innovative battery protection circuit is interleaved with a standard twin tub CMOS process flow. In the standard process, N-and P-channel device regions are defined and then a P-well formed by implanting boron into the N-channel device region and an N-well formed by implanting phosphorous into the P-channel device region. These implants are then driven down into the substrate and then active regions defined therein and separated by a layer of field oxide. Typically, a layer of nitride is disposed over a thin oxide layer to define the active regions and then a field oxide grown on the portions of the substrate not having nitride formed thereover.

After formation of the field oxide isolation regions, the residual nitride layers are removed. There is still a layer of gate oxide over the active region remaining on the surface thereof. The surface is then masked for the implanting of the N-type region 34. This implant is achieved with phosphorous at an energy level of 180 KeV at a dosage of $5 \times 10^{13} cm^{-2}$. After implanting of the N-type region 34, the residual oxide on the surface of the active region is removed and then a strip gate oxide is formed over the substrate. The active regions are then implanted to adjust the transistor threshold voltages.

After threshold voltages are adjusted, the strip gate oxide is removed and the final gate oxidation is performed, followed by polysilicon deposition and subsequent doping thereof. The poly is then patterned and etched to define the various gates and interconnects at a first level of poly. The N-channel source and drain areas are then defined to form the source/drain implants. This is an n+ implant utilizing arsenic, which implant is also utilized to form the n+ regions 40 and 42. The substrate is then masked to form the p+ source/drain implants, at which time the p+ regions 36, 38 and 26 are formed. Thereafter, the interlevel oxide is formed by depositing oxide therover and this oxide is subjected to a thermal cycle to reflow the oxide and to provide the source/-drain activation and drive steps. The subsequent contacts are then defined and etched and then a layer of metal deposited thereover. The metal layer is then patterned and etched to define the various metal interconnects.

Figure 16H:
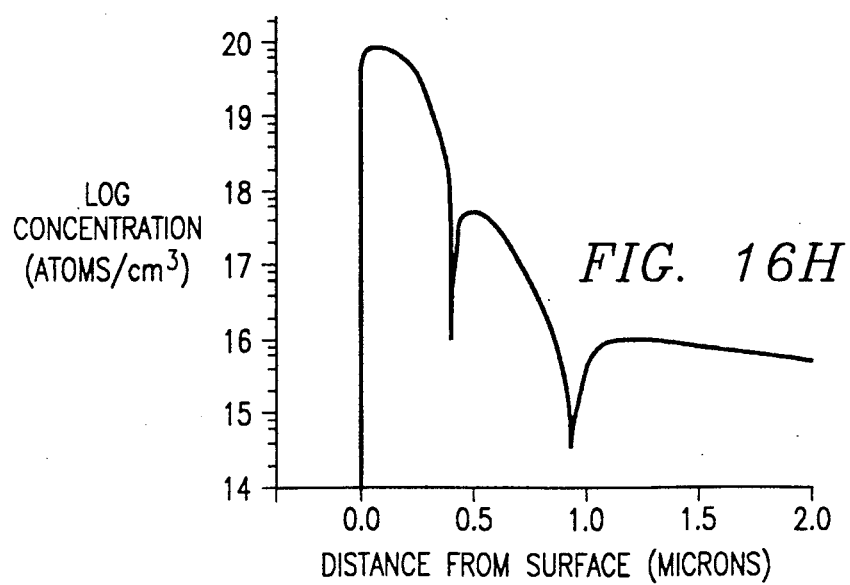
FIG. 16H illustrates a dopant profile of a sample embodiment of the battery protection circuit of FIG. 16D.

Referring now to FIG. 16H, there is illustrated a vertical dopant profile through regions 36, 34, and 32 of FIG. 16D. The dopant profile illustrates that the p+ region 36 has a surface concentration of approximately $1 \times 10^{20}$ cm$^{-3}$ and a thickness of approximately 0.35 microns. The N-type region 34 has a thickness of approximately 0.4 microns with a peak concentration of approximately $4 \times 10^{17}$ cm$^{-3}$. The concentration level of the P-well 32 is approximately $1 \times 10^{16}$ cm$^{-3}$. Therefore, the PNP transistor 44 formed by the p+ region 36, the N-type region 34 and the P-well region 32 has a base width of approximately 0.4 microns.

Figure 16I:
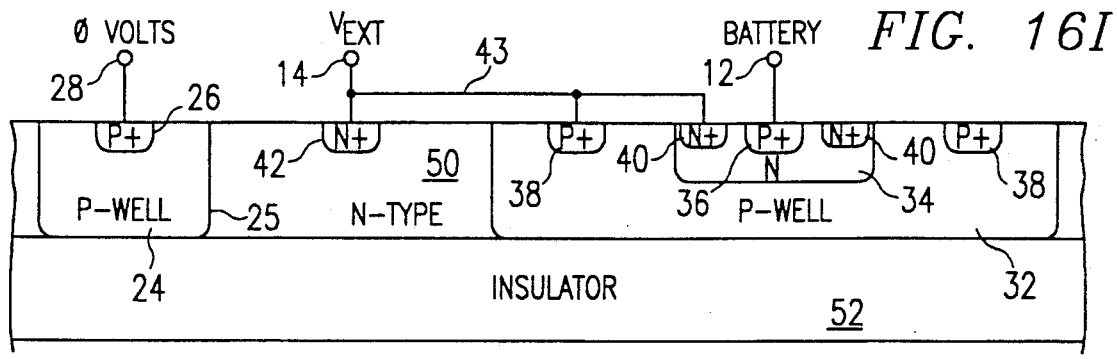
FIG. 16I illustrates a cross-sectional view of an alternate embodiment of the disclosed innovative battery protection circuit utilizing a Silicon-On-Insulator construction.
Figure 16J:
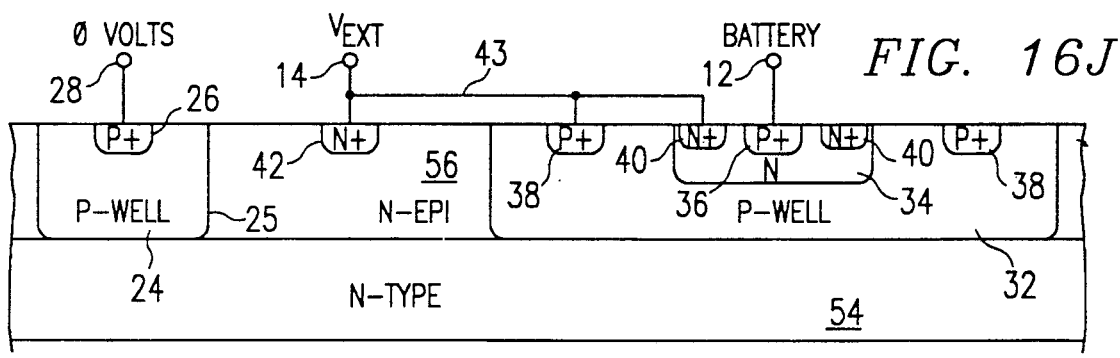
FIG. 16J illustrates a cross-sectional diagram of yet another embodiment of the disclosed innovative battery protection circuit, wherein the structure is fabricated in an epitaxial layer disposed on top of semiconductor material.
Figure 16K:
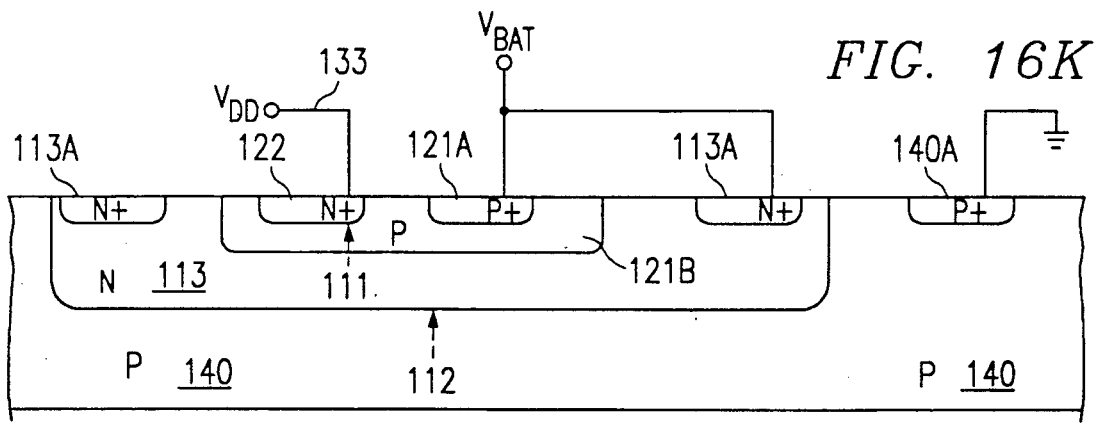
FIG. 16K shows an example of a battery protection circuit in a CMOS integrated circuit with a P-type substrate.

Referring now to FIG. 16I, there is illustrated an alternate embodiment of the disclosed innovative battery protection circuit. In this alternate embodiment, the diode structure of the present invention is formed in an N-type substrate 50, which N-type substrate 50 is disposed over a layer of insulating material 52. This is normally referred to as Silicon-On-Insulator (SOI) technology. In this type of technology, an N-type substrate is first formed and then a layer of insulating material formed on the lower surface thereof. The N-type substrate 50 is typically dimensioned to equal the thickness of the P-well 32 and the P-well 24 such that no N-type material is disposed therebelow. In this manner, isolation between laterally disposed devices is increased.

There are numerous techniques for fabricating integrated circuits utilizing SOI technology. Some of these techniques require formation of the active device on the surface of an N-type substrate followed by deposition of a thick layer of oxide and polysilicon thereover. The substrate is then held from the upper side and the lower surface thereof etched down a predetermined distance. Typically, some type of heavily doped buried layer is implanted into the substrate to form an etch stop layer. The insulator is then formed on the remaining surface of the substrate under the active devices, the thick layer of polysilicon and oxide removed and the final patterning performed on the upper surface of the substrate. However, this is only one technique and numerous other techniques are available for realizing SOI technology.

Referring now to FIG. 16I, there is illustrated yet another embodiment of the disclosed innovative battery protection circuit. An N-type substrate 54 is provided upon which a layer of epitaxially grown N-type semiconductor material 56 is grown. The P-well 24 and the P-well 32 are then formed therein with the N-type epitaxial layer 56 having a thickness approximately equal to that of the P-wells 24 and 32. The N-type substrate 54 has a higher doping level than the epitaxial layer 56, resulting in the parasitic transistors being confined primarily to the epitaxial layer 56. The epitaxial layer 56 is formed utilizing conventional processes well-known in the art.

In summary, there has been provided a battery protection device that reduces leakage due to the existence of a parasitic PNP transistor between the battery terminal and an adjacent P-well. The battery protection device includes a diode that is enclosed by a layer of P-type material. The layer of P-type material is operable to collect minority carriers to prevent collection thereof by an adjacent P-well with a reverse biased PN junction.

FIG. 16K shows another embodiment of the disclosed innovative battery protection circuit, which has been found to be advantageous for use with P-type substrates. This is the embodiment which is preferably used, with the layout shown in FIG. 16A, in the integrated circuit layout of FIG. 6. Specifics for this embodiment will be described in the context of a 1.2 micron CMOS process, but of course the process can readily be scaled or modified, as will be apparent to skilled CMOS designers and process engineers.

The substrate 140, in this embodiment, is P-type silicon, doped to a bulk resistivity in the neighborhood of 30–40 ohm-cm. The substrate is shown ohmically connected to ground through a shallow P+ diffusion 140A, but in addition to (or instead of) this contact, a backside contact may also be used for connection to ground.

An N-well 113 has essentially the same doping profile as the N-wells which are used to build PMOS active devices, and is formed in the same series of implantation and drive steps. In this sampe embodiment, the N-well is about 4 microns deep, and has a vertically graded dopant concentration in the neighborhood of $2-3 \times 10^{16}$ cm$^{-3}$. A shallow N+ diffusion 113A is formed inside this region, by using the same implant as is used to form the N+ source/drain regions in the active device regions. This shallow N+ diffusion will normally be quite heavily doped, but the depth and concentration of this region are not particularly critical for purposes of the structure of FIG. 16K. Typically the concentration might be in the range of $1 \times 10^{19}$ cm$^{-3}$ to $3E^{20}$ cm$^{-3}$, with an effective depth in the neighborhood of 0.3 microns. The shallow N+ diffusion 113A provides ohmic contact to wiring 131, which is electrically connected to the battery voltage $V_{BAT}$.

An intermediate-depth P-type region 121 is formed inside the N-well 113. In the presently preferred embodiment, this is formed by implanting boron at an areal dose in the approximate range of $6 \times 10^{13}$ cm$^{-2}$ to $1 \times 10^{14}$ cm$^{-2}$ at an energy of about 30 keV, but of course other doses or energies can be substituted.

A shallow N+ diffusion 122 is formed inside the region 121, by using the same implant as is used to form the N+ source/drain regions in the active device regions. This shallow N+ diffusion will normally be quite heavily doped, but the depth and concentration of this region are not particularly critical for purposes of the structure of FIG. 16K. Typically the concentration might be in the range of $1 \times 10^{19}$ cm$^{-3}$ to $3 \times 10^{20}$ cm$^{-3}$, with an effective depth in the neighborhood of 0.3 microns. The N+ diffusion 122 makes ohmic contact to wiring 133, which is routed to provide the $V_{DD}$ on-chip supply voltage for the active circuits on the chip.

A shallow P+ diffusion 121A is also formed inside the region 121B, by using the same implant as is used to form the P+ source/drain regions in the active device regions. This shallow P+ diffusion will normally be quite heavily doped, but the depth and concentration of this region are not particularly critical for purposes of the structure of FIG. 16K. Typically the concentration might be in the range of $1 \times 10^{19}$ cm$^{-3}$ to $3 \times 10^{20}$ cm$^{-3}$, with an effective depth in the neighborhood of 0.3 microns. The shallow P+ diffusion 121A provides ohmic contact to wiring 131, which is electrically connected to the battery voltage $V_{BAT}$.

Figure 16L:
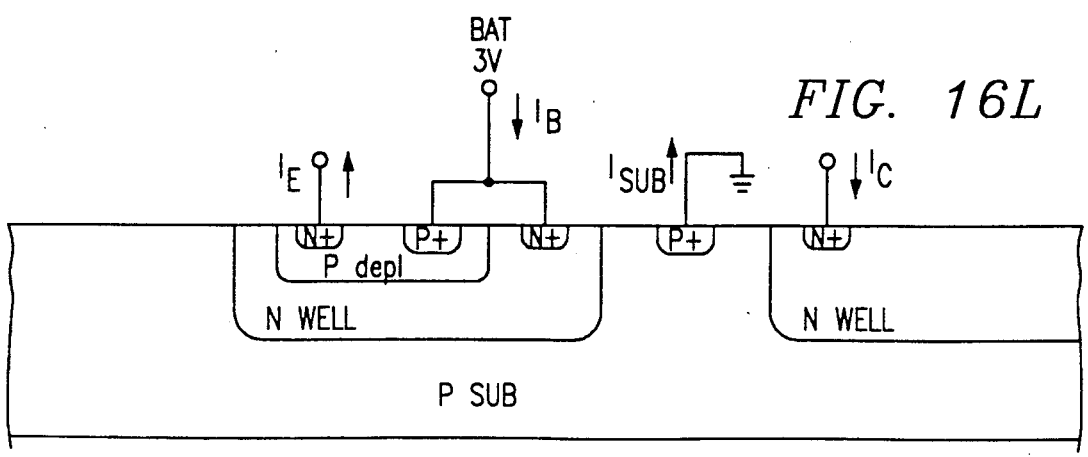
FIG. 16L shows a test structure which is similar to the device structure of FIG. 16K.
Figure 16M:
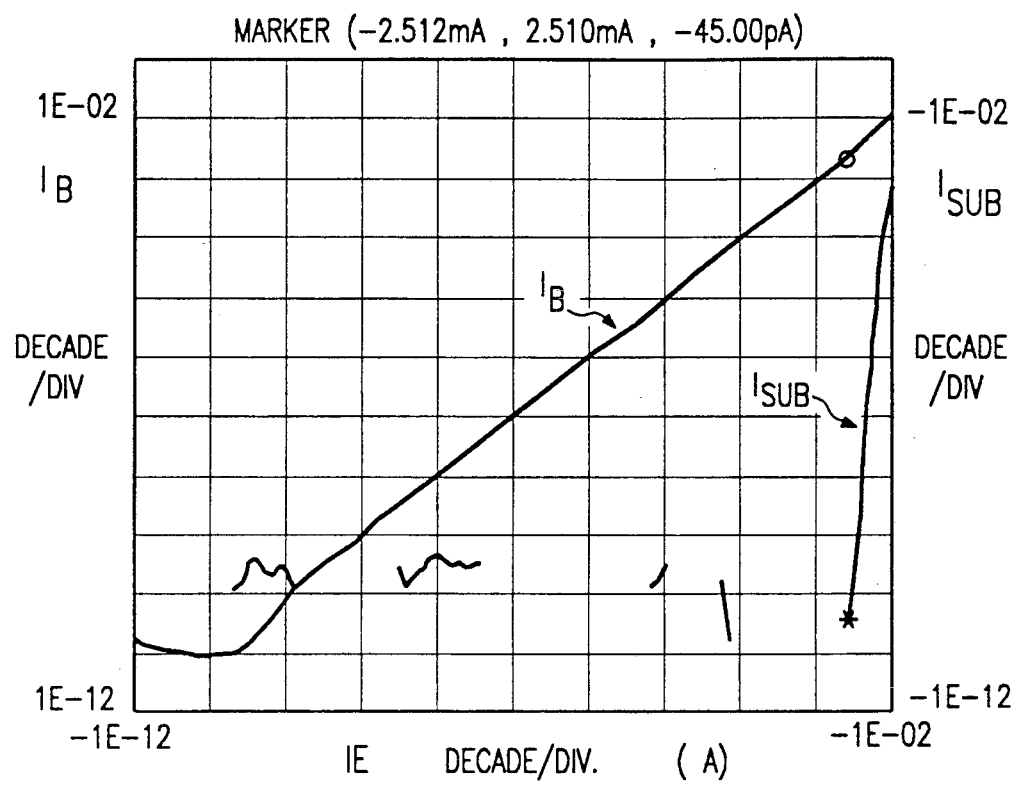
FIG. 16M shows test data for this structure.

FIG. 16L shows a test structure which is similar to the device structure of FIG. 16K, and FIG. 16M shows test data for this structure. In recording this data, collector terminal (marked $I_C$ in FIG. 16L) was connected to the emitter terminal (marked $I_E$). The battery was held at a constant voltage $V_{BAT}=3$ V. The battery current $I_B$ and substrate current $I_{SUB}$ were measured as a function of the emitter current $I_E$ drawn from the second region 122. Thus, two curves are shown in this log-log plot. Note that the substrate current $I_{SUB}$ remains down in the noise level until the emitter current $I_E$ becomes quite large. (This low value of the substrate current is highly advantageous.) At the point circled on the $I_B$ curve, $I_E = -2.512$ mA, and $I_B = 2.510$ mA. At the point marked with an asterisk on the $I_{SUB}$ curve, $I_E = -2.512$ mA, and $I_{SUB} = -45$ pA.

FIG. 16N shows a further alternative embodiment, wherein a diffusion structure is connected to provide ESD protection for an I/O connection of a battery-powered integrated circuit. Note that the region 122 is not connected to provide a $V_{DD}$ output, but instead is connected to an input/output line 134. (The I/O terminal can also optionally be connected to a transistor gate, for amplification of incoming data signals, but this is not necessary.) The I/O line 134 is also connected to be driven by an NMOS output driver 150. This transistor, as shown, includes a first source/drain diffusion 151, which is ohmically connected to the I/O line 134, a second source/drain diffusion 152, which is ohmically connected to ground, and a gate 153 which can be driven by a data-output signal DO-bar. (Of course, other device structures, such as additional ESD protection structures, can optionally be combined with the structure shown.)

The structure of FIG. 16N, in the preferred embodiment, uses several enclosure relationships in its geometry. The central diffusion 122 is shown small, for clarity, but may itself be large. The P+ diffusion 121A preferably runs all around the P-type intermediate diffusion 121. As presently contemplated, lateral dimensions for this example are as follows. (However, it must be understood that these dimensions are intended to be purely illustrative, and should not be strictly relied on. These dimensions are included merely to help show the inventors' present views as to the best mode of practicing this embodiment of the invention.) The N+ diffusion 122 is preferably separated from P+ diffusion 121A by a minimum spacing of at least 3 microns (in a 1.2 micron layout), and the ring diffusion 121A is preferably at least 5 microns wide. The N+ diffusion 113A preferably runs in a ring all around the edge of the well 113. The N+ diffusion 122 is preferably at least 5 microns wide, and is separated from the P+ diffusion 122 by at least 3 microns. The P+ diffusion 140B, in the substrate 140, preferably runs all the way around the outside of the N-well 113. The minimum spacing between P+ diffusion 140B and N+ diffusion 113A is preferably at least 3 microns, and P+ diffusion 140B is preferably at least 5 microns wide.

The output transistor 150 is preferably surrounded by a ring 154 of N-well, and this ring is tied to ground through a shallow N+ diffusion 155 at its surface.

The structure of FIG. 16N has the advantage that, when a negative transient appears on the I/O line 134 for any reason (such as electrical noise on a line, or electrostatic discharge), most of the current sourced to this negative transient will be taken from the junction 111, rather than from the output transistor. Thus, minority carrier diffusion to discharge the battery is minimized, and battery lifetime is not decreased by such transient events. This advantageously provides a system which is longer-lived and more reliable. However, when the I/O line 134 is in its normal range of positive voltages (e.g. during normal operation at TTL levels), the first junction in the diode structure will be reverse biased, and will not lead the line 134.

Figure 16P:
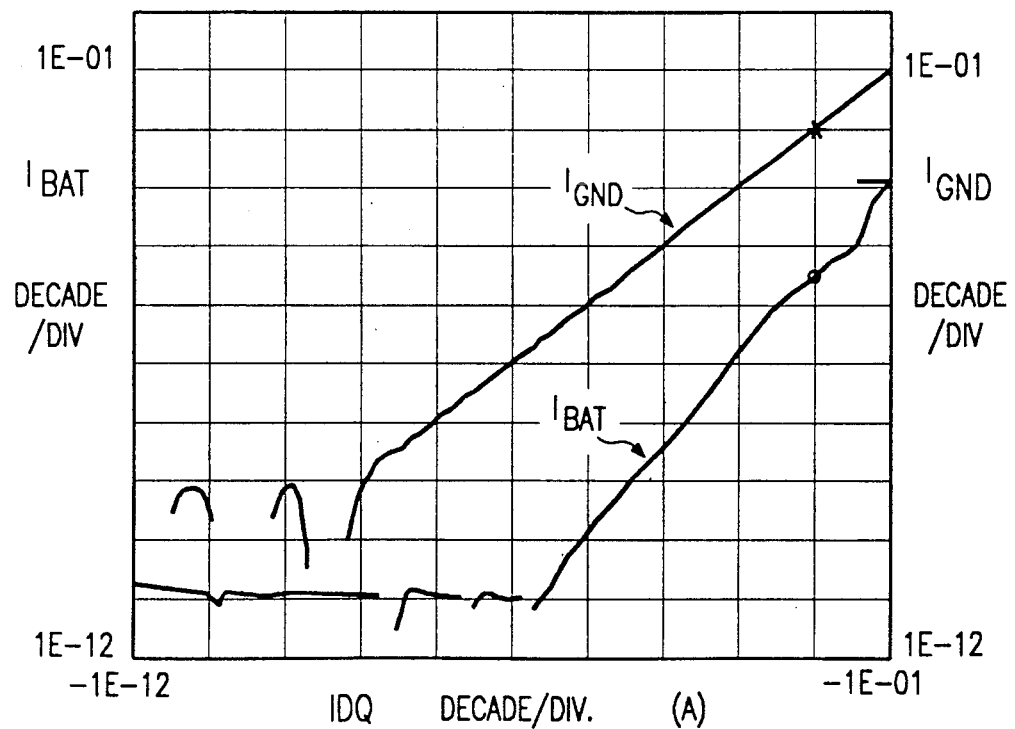
FIG. 16P shows test data for the device structure of FIG. 16N.

FIG. 16P is a log-log plot of data for the device structure of FIG. 16N. A controlled current sink $I_{DQ}$ is applied to the I/O connection 134, and two current components are measured as a function of $I_{DQ}$: the current $I_{BAT}$ drawn from the supply voltage $V_{BAT}$, and the current component $I_{GND}$ drawn from the ground connection. At the point circled on the $I_{BAT}$ curve, $I_{DQ} = -10.00$ mA, and $I_{BAT} = 18.15$ microA. At the point marked with an asterisk on the $I_{GND}$ curve, $I_{DQ} = -10.00$ mA, and $I_{GND} = 9.982$ mA.

In the structure measured in FIG. 16P, the effective area of the first junction 111 (which is protected by the second junction 112) is approximately ten times that of the junction area in the output transistor 150 (which also can source current from ground). Thus, a current differential of about 10:1 might be expected, purely due to the geometrical ratios. However, higher ratios (almost 100:1) are actually achieved. Thus, FIG. 16P shows that the ratio of ground-sourced current to battery-sourced current is greater than 500:1 is achieved for a 10 mA load, and even higher ratios can be achieved at lower load currents.

ESD Protection Diode Layout

FIGS. 16A-1 to 16A-8 show the layout of the ESD protection diode, in the presently preferred embodiment. This dode has doping profiles as just described with reference to FIG. 16N. Note that the structure shown actually includes two diodes in series: diode 618 provides the primary protection. Diode 619 is interposed between diode 618 and the substrate, to provide some additional protection. Note that the n+ pattern of diode 619 is slightly different, to impose a longer current path. This provides a slight series resistance between the power output and the active circuits, which helps to isolate the active circuits from the ESD discharges.

Note that the pattern shown includes rounded corners on the metal, n-well, and n+ patterns. These rounded corners help to reduce the geometry-dependent electric field enhancement which would otherwise occur at corners.

It is contemplated that, for even greater ESD protection, it may be preferable to narrow the width of the n+ diffusions in the diode layout. This would further reduce series resistance in the path of electrostatic discharges.

The module of the presently preferred embodiment has been tested, and found to withstand a 7000 V positive discharge, and to be capable of withstanding negative discharges greater than 10,000 V. (Under positive discharges, data loss does not occur until 7000 V, and device damage does not begin to occur until 10000 V (one microAmp of leakage). Negative discharges cannot cause data loss or device damage until voltages greater than 10000 Volts (how much greater is not known.)

Operation

The implementation of data transfer operations, in the presently preferred embodiment, will not be described.

All communications to and from the token are accomplished via two physical connections, the "Data" line, and the ground return line. The reading and writing of taken data is accomplished through the use of time slots and a command word protocol.

Electrical I/O Relationships

The bus protocol is also designed to minimize the charge transfer out of the battery in the module. This is done by using an "open-collector" type architecture. The protocol has been specified so that the module never sources current to the data line, but only sinks current.

When a data module is in contact with a host system, the host system initially pulls up the data line. (The module also preferably contains a very high-impedance pull-down resistor at this node, but this is done, in the preferred embodiment, merely to avoid the risk of floating nodes.) The host system initiates each stage of a data transfer operation by driving the data line low. The module detects this falling edge, and one of several further events can then occur.

If the module is being read (as previously determined by overhead bits), the module, after seeing the falling edge which starts the cycle, either will or will not turn on its NMOS pull-down transistor, depending on the value of the data bit being read at that cycle. When the NMOS pull-down is turned on, the module lets its preset timing period elapse, and then turns off the NMOS pull-down. Thus, when the system wants to read from the module, it applies a falling edge, waits a short time to be sure that the module has received the falling edge, and then attempts to pull up the data line, using a pull-up resistor which cannot overpower the NMOS pull-down transistor in the module. After waiting a sufficient time for the pull-up resistor to have raised the line to a high level (if the NMOS pull-down is off), the system tests the data voltage to ascertain the data bit. The system then waits for the maximum time period of the module delay to elapse, plus enough time for the data line to stabilize at a high level, and then sends another falling edge to read the next bit.

If the module is being written to (as previously determined by the overhead bits), the module, after seeing the falling edge which starts the cycle, waits for its preset timing period to elapse, and then stores the logic value of the data line. Thus, when the system wants to write to the module, it applies a falling edge, waits a short time to be sure that the module has received the falling edge, and then drives the data line either high or low, depending on the data bit. The system then waits for the maximum time period of the module delay to elapse, restores the data line to a high level, allows enough additional time for the data line to stabilize at a high level (and for the edge detector in the module to reset itself), and then sends another falling edge to write the next bit.

All Data Transfer operations are performed by initially setting the token into a known state, issuing a Command Word, and then performing the selected operation, either reading the contents of the token or writing new data into the token. Each Data Transfer operation consists of 264 Data Time Slots: 8 are for the Command Word and 256 are for the data bits.

To initially set the token into a known state, when a new token is first inserted into a host system, either 264 or 1032 Write Zero Time Slots are issued (depending on the memory density). These Write Zero Time Slots will not corrupt the data held within the token since a Command Word has not been written. This operation will increment the address pointer internal to the token to its maximum count value. Upon reaching this maximum value, the token will ignore all additional Write Zero Time Slots issued to it and the internal address pointer will remain locked at the top count value. (This backed condition is removed by the issuing of a Write One Time Slot.)

Once the token has been set into a known state, a Command Word is transmitted to the token, using 8 Write Data Time Slots. This resets the address pointer internal to the token and prepares it for the appropriate operation, either a read or a write.

After the Command Word has been transmitted to the token, the appropriate number of Data Time Slots will be issued to the token by the host. In the case of a read operation, these will be Read Data Time Slots. In the case of a write operation, these will be Write Data Time Slots. The exact number of Data Time Slots generated by the host is dependent upon the memory density of the part being used (256 or 1024).

Block Transfer

All data transfers are preferably done by reading or writing the entire contents of memory as a single serial stream.

Overhead Bits

A command word, which is a short block of overhead bits, is sent from the host system to the portable module at the start of each transfer, to define the transfer type. FIG. 4 shows the organization of the overhead bits which are used in each block transfer.

The Command Word consists of 8 bits which are transmitted from the host to the token with write data time slots (FIG. 4). The first bit of the Command Word must be set to a logic 1 level. The next two bits are the Select Bits which relate to the part dash number. The remaining five bits determine whether a read or a write operation is to follow. If a write operation is to be performed, all five bits are set to a logic 1 level. If a read operation is to be preformed, any or all of these bits are reset to a logic 0 level. Each of these bits is transmitted to the token with a separate write data time slot.

Address-Pointer Reset

When a host system first makes contact with a module, the host system sends a long string of write-zero commands, followed by a write-one command, to the module. The module contains a counter, which monitors the incoming bit stream for nonstop sequences of write-zero commands. If the module receives a nonstop sequence containing as many write-zero commands as the total length of the memory, the counter will freeze until the chip is reset. The chip will be reset if and only if an incoming "1" bit is seen while the counter is frozen.

That is, in the presently preferred embodiment (256 bits of memory), the data output of the last counter stage (indicating that the counter has rolled over from 255 to 256) triggers a flip-flop whose output is connected, through a NOR gate, to cut off the counter's clock input.

This provides a reset capability, whereby the system can ensure that the starting address of the module is accurately known. Thus, on every insertion of a new module, the system can send such a reset sequence to initialize the address pointer in the module. Note that this address-pointer-reset is only necessary once per insertion. The sequence of write-zero commands will not normally destroy data, because the module never receives the overhead bit sequence which would tell it to enter write mode. (The only conditions under which data could be destroyed by these commands is when the module has been interrupted in the middle of a previous write sequence, and in this case the data may be presumed corrupt anyway.)

Read/Write Timing

There are two types of write data time slots, Write One Time Slots and Write Zero Time Slots. A write data time slot is initiated when the host pulls the Data line from a high logic level to a low logic level. All write data time slots must be a minimum of 60 microseconds in duration with a minimum of 1 micro-second recovery time between write cycles. In this example, the crude time base in the module provides a 4:1 range in the possible time durations: timing relations are defined with respect to a one-shot in the module which will provide a pulse width of at least 15 microseconds (but not more than 60 microseconds).

This one-shot is preferably trimmable, to a wide variety of speed ranges. Moreover, other circuit arrangements could be used instead, to generate a timing base. Thus, in the following example, the timing window of 15–60 microseconds does not delimit the claimed inventions, but merely serves to illustrate how the innovative one-wire bus protocol can cope with timing uncertainty. The same principles of operation could be used if the modules were trimmed to have varying time delays within the range of (for example) 1–4 microseconds.

Figure 2A:
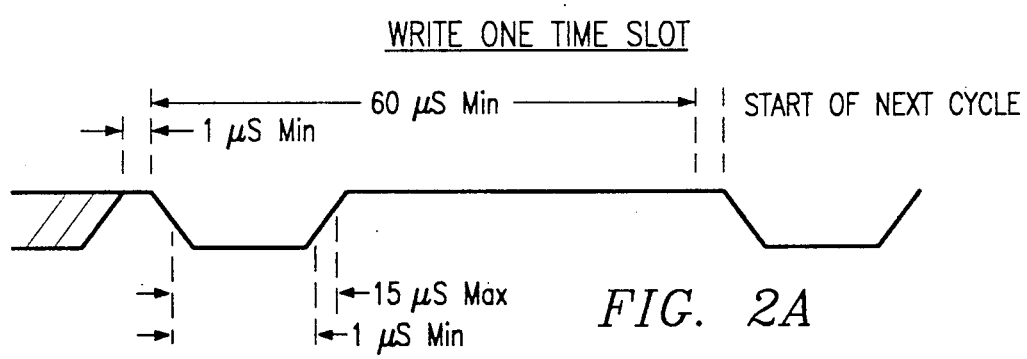
FIG. 2A is a timing diagram of a write-1 operation.

FIG. 2A is a timing diagram of a write-1 operation, in the module of the presently preferred embodiment. For the host to perform a Write-1 operation, the following steps occur:

1. The Data line is held at a high level for at least one microsecond. This ensures that the edge detector in the module will have sufficient set-up time.

2. The Data line is pulled to a logic low level. This provides the falling edge which the module uses to time its operations from.

3. The Data line is then held low for at least one microsecond, to ensure that the falling edge is detected by the module.

4. After the falling edge, the Data line must be driven high within 15 microseconds, and held high for at least 60 microseconds (from the time of the falling edge in Step 2). This ensures that the Data line will be high when the pulse generated by the one-shot in the module ends. When the pulse ends (producing a falling edge), the module will sample the logic level of the data line, to determine whether a 0 or a 1 is the data value.

Steps 1–4 can then be repeated, to write the next bit.

Figure 2B:
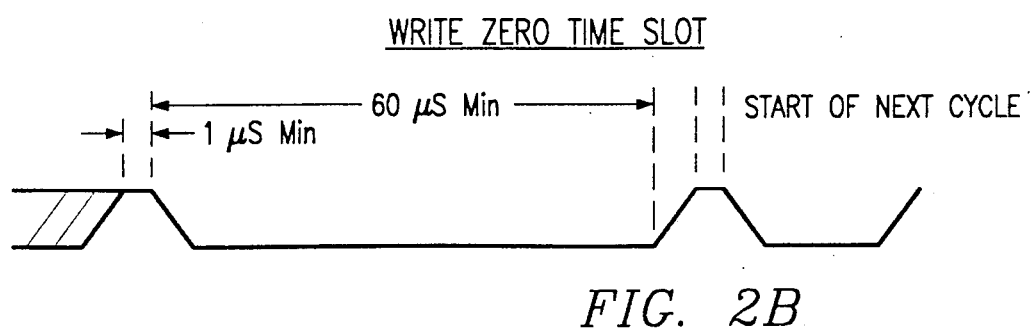
FIG. 2B is a timing diagram of a write-0 operation.

FIG. 2B is a timing diagram of a write-0 operation, in the module of the presently preferred embodiment. The steps in this operation are the same as the steps in a Write-1 operation, except that, in step 4, the Data line is held low during the window of 15–60 microseconds after the falling edge. This ensures that the Data line will be low at the end of the pulse generated by the one-shot in the module.

FIG. 3 is a timing diagram of a read operation, in the module of the presently preferred embodiment. When data is to be read from the token by the host, the host will generate the read data time slots. A read data time slot is initiated (as in steps 1–3 of the write-1 operation) when the host pulls the Data line from a logic high level to a logic low level. As soon as the module sees this falling edge, it will conditionally turn on its pull-down transistor (depending on the value of the data bit being read), and will leave the pull-down transistor turned on (conditionally) unitl the end of the pulse generated by the one-shot. Thus, during a read operation, after the falling edge (and the following guard time), the host waits for enough time for the data line to have been pulled up to a high level (if the module is not holding it down), and then samples the data line. In the presently preferred embodiment, where the host port has a 5 Kilohm pull-up resistor, the host preferably tests the data line 10 microseconds after the falling edge. From 15 to 60 microseconds after the falling edge, the state of the data line is uncertain, since it is not known whether the module has yet timed out and released the data line. All read data time slots must be a minimum of 60 microseconds in duration, with a minimum of 1 micro-second recovery time between read cycles.

The module's time base varies widely between parts, and may also be quite dependent on temperature (which will typically vary the battery voltage). However, the module's time base will not vary as widely from moment to moment. Thus, in a less-preferred alternative embodiment, the host can measure the time base of the module (by performing more frequent samplings during a read operation), and maximize the data rate for the particular module being read. However, this is not preferred, since the most preferred system embodiment will typically have only brief exchanges (one read, or one read plus one write) in each contact of a host with a particular module.

System Using Electronic Tokens

These innovative ideas are used as parts of a very innovative system architecture. The electronic module enabled by the innovative teachings herein is extremely compact and extremely cheap. From a systems point of view, this module is in some way more analogous to a read/write bar code than to a conventional electronic memory system.

Thus, this innovative module can be used for price tags, for inventory tags, for work-in-process monitoring, for retail sales (to permit customers to select merchandise (e.g. by taking one module or a handful of modules to a cashier or to an automated check-out machine), without exposing the actual inventory to pilferage), and for a wide variety of other such compact data-transfer applications. Thus, the innovative module described can be regarded as an electronic token, which is as portable and rugged as a metal token, but which is far more versatile.

Host System

An electronic token can be interfaced to by an open-collector pin in a very wide variety of microprocessors. Moreover, some port pins on some microprocessors have very weak pull-ups, so that these port pins could also be used. Alternatively, a microprocessor which did not have any such pins available could buffer its port through a standard TTL open-collector buffer.

It is particularly advantageous to interface a token receiver to a standard microcomputer system, such as an 80286- or 80386-based PC clone.

Figure 12:
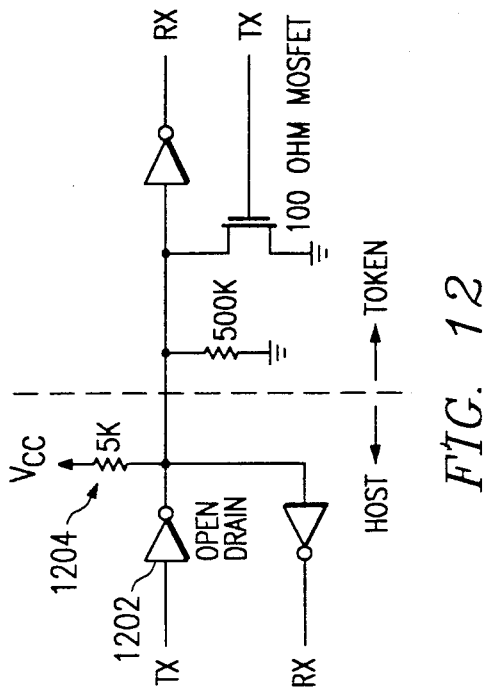
FIG. 12 shows a sample host system, which can interface to electronic token modules like the module of FIG. 1.

FIG. 12 shows a simple example of a host system, which can interface to electronic token modules like the module of FIG. 1. In this example, the token data line is taken from an open-collector pin of a microprocessor (such as a Motorola 68000). A 5 kilohm resistor 1204 provides a pull-up to $V_{cc}$, and an open-drain driver 1202 amplifies transmitted signals.

Other sample embodiments of the host system will be discussed below, with reference to FIGS. 19 and 20.

Physical Interface for Receiving Electronic Tokens

Preferably each host system uses a physical configuration of electrical contacts which provides rapid contact for electronic data modules (tokens). A slot, dimensioned to receive electronic tokens, includes a grounded contact positioned to make contact to the edge of a token which may be inserted, and two data contacts which are positioned to make contact to the opposite faces of the token. Each of the data contacts is connected to an open-collector driver circuit, including a pull-up resistor which will bring the potential of the contact high when the slot is empty. The token is shaped so that its edge, and one of its faces, are connected to the token's ground line, and the other face is the token's data line. Thus, when a token is inserted (no matter which way the token is facing), one of the two data contacts will be immediately pulled to ground, by short-circuiting across the ground plane of the token. The system can thereby recognize that a token has been inserted, and that the other data contact (the one which was not shorted to ground) can communicate with this token's data line. Thus, even though the token itself is asymmetric, and even though the directional orientation of the token is not initially known to the system, no physical asymmetry needs to be introduced into the token or the slot to assure proper data interface.

FIG. 17 shows the configuration of contacts used, in one embodiment, in a host system to contact electronic tokens. A slot 1720 in a body 1710 is dimensioned to accept a token (e.g. like the tokens of FIGS. 1A or 1B). Contact 1736, in the bottom of the slot 1720, is positioned to contact the edge of an inserted token. Contacts 1734 and 1732, on opposite sides of the slot 1720, will contact the two opposite faces of the token.

Thus, when a token like that in FIG. 1 is inserted into a slot like that of FIG. 17, contact 1736 will always contact case portion 0100B. Case portion 0100B will also contact one of the other contacts 1732/1734, and pull it to ground. Thus, when a token is inserted, the host system will see one of the data lines DQ1/DQ2 pulled to ground. This tells the host that a token has been inserted, and it also tells the host which of the two data lines DQ1/DQ2 the token's data lead is connected to. (The token's data lead will be found connected to the data lead which was not pulled to ground.)

Alternative Physical Interface—Hand-Held Wand

In an alternative embodiment, a wand provides rapid contact to a two-terminal electronic token data module. The wand includes one contact which will make contact to the periphery of an electronic token which the wand is pressed against, and one contact which will make contact to the center of the token. Preferably the wand includes a base portion which is shaped to be worn on the second joint of a user's finger. This wand can be used for very rapid manual contacting of electronic tokens in various physical positions. This can be very advantageous in a variety of data collection/updating applications such as retail checkout, or tracking work-in-progress in a computer-assisted-manufacturing environment.

Figure 15A:
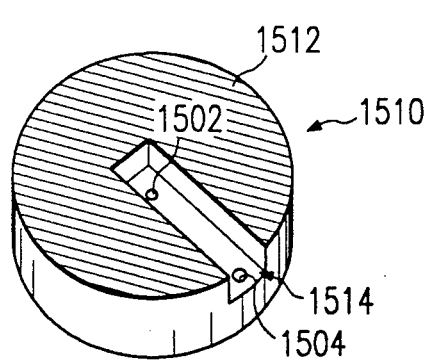
FIGS. 15A, 15B, and 15C show the finger-mounted wand used, in the presently preferred system embodiment, for manually contacting multiple electronic tokens successively.
Figure 15B:
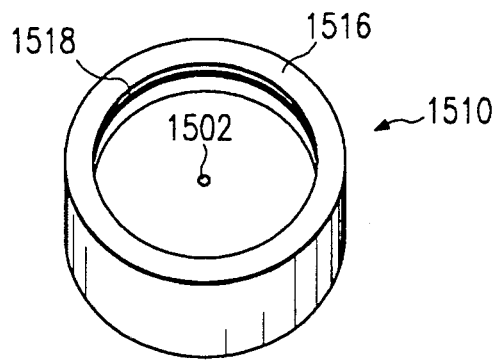
Figure 15C:
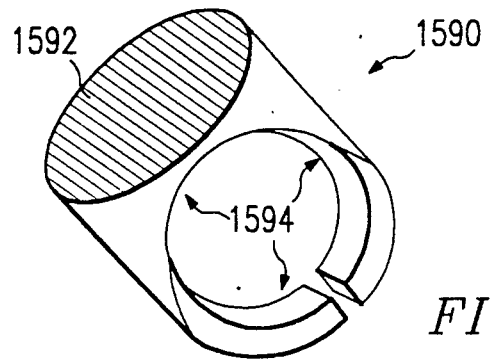

FIGS. 15A, 15B, and 15C show the finger-mounted wand used, in the presently preferred system embodiment, for manually contacting multiple electronic tokens successively. This wand is particularly suitable for contacting tokens which are firmly affixed to solid items, for applications such as workpiece identification in computer-integrated manufacturing, or inventory control, or equipment maintenance records.

FIGS. 15B and 15A shows the top portion 1510 of the wand of the presently preferred embodiment. The entire structure shown, except for conductive ring 1518, is preferably molded from a non-conductive polymer. A lip 1516 surrounds a recess which is dimensioned to mate with tokens of a known dimension. A thin ring of conductive polymer 1518 circles the inner edge of the lip 1516. This ring will make the actual electrical contact to the edge of a token. The ring 1518 provides sufficient elastic deformation to assure that secure contact is made. A through-hole 1502 in the center of the recess carries a wire (not shown, for clarity) which contacts the center of the token when contact is made. FIG. 15A shows the back side of the top portion 1510. Note that another through-hole 1504 permits a second wire (also not shown) to contact the backside of conductive ring 1518. A groove 1514 permits the two wires to be led out, for connection to a host computer system.

FIG. 15C shows the finger-mounted base portion 1590, which preferably is cemented (or otherwise attached) to a top portion 1510, like that shown in FIGS. 15A and 15B. The flat surface 1592 is attached to flat surface 1512 on the top portion 1510. Aperture 1594 is shaped to fit a user's finger. Preferably this is shaped to fit the second joint of the user's finger, unlike normal ring sizing, where the ring is placed on the first joint of the finger (nearest the palm).

Thus, the complete structure is compact, and can be easily worn on the user's finger without interfering with other activities. The lead wires can be connected to, for example, a belt-mounted small data-holding computer unit, or to a belt-mounted RF interface unit.

Electrical Interface from Host System

The host system must have an open drain driver with a pull-up resistor of approximately 5 Kilohms to $V_{cc}$ on the Data signal line. The token has internally an open drain driver with a 500 Kilohm pulldown resistor to ground (FIG. 6). The open drain driver allows the token to be powered by its small internal energy source and still have the ability to produce sufficiently large voltage swings at the outputs. The pulldown resistor holds the Data input pin at ground potential when the token is not connected to the host.

FIG. 18 shows the electrical driver configuration used on the host side, in one class of embodiments, to interface to electronic tokens. Two open-collector interfaces are provided, 1810A and 1810B. The data line $DQ_1$, from a contacting fixture (e.g. like that shown in FIG. 17) is connected to one of the interface circuits 1810S, and the other data line $DQ_2$ is connected to the other interface circuit 1810B.

When the host system has not been communicating with a token, it can simply poll the XOR value the two data input lines $DI_1$ and $DI_2$ to test for the presence of a token. When a token has been inserted, the host can begin to drive the DQ line which was not pulled low by the insertion of the token. As discussed below, the host would normally issue a reset sequence, read the memory, and then (in some cases) write the memory.

Electrical Interface from Token to Standard RS232 Interface

The presently preferred embodiment also uses an innovative electrical interface to the tokens, which permits interfacing to tokens with a wide variety of computers, including a tremendous variety of personal or other computers, as long as the computer includes an interface to RS232 (or some comparable standard). The token has a one-wire-bus interface, implemented in a battery-backed open-collector architecture, which provides a read/write interface. The communication protocol expected by the token has been specified so that the token never sources current to the data line, but only sinks current. The communication protocol also includes time-domain relations which are referenced to a very crude time base in the token, and the system must preserve timing relations which will be satisfied by tokens in which the time base takes on any of the wide range of foreseeable speeds. To interface to this protocol, the programmable capabilities of the standard UART chip in the computer's RS232 interface are exploited to provide adaptation to the time base requirements of the module. This is done by writing an entire byte of output from the UART, at a much higher baud rate than the module can be relied on to accept, to write a single bit of data into the module. The read-data line (RX) of the UART is tied back to the transmit-data line (TX) through a resistor, so that UART will also always report a read of the same data byte being written, unless the token has turned on its pull-down transistor. An electrical network is used at the interface which (in effect) reverses the ground plane identification of the two leads, but which does provide the correct signal polarity to the token for signal discrimination in read mode.

Figure 19:
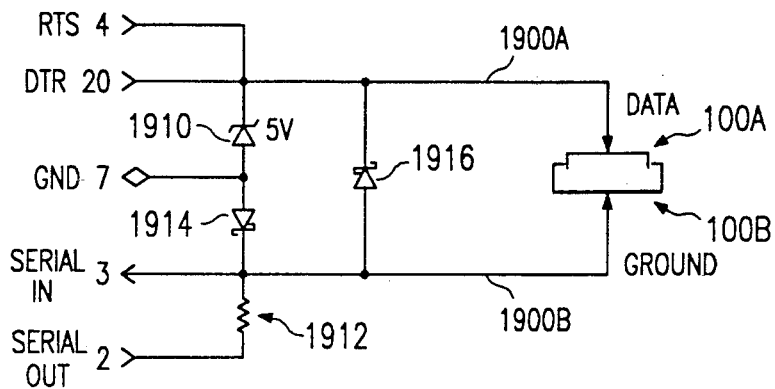
FIG. 19 shows a network used, in another embodiment, to interface from a serial port to an electronic token.

FIG. 19 shows a network used, in the preferred version of this embodiment, to interface from a serial port to an electronic token. Data line 1900A contacts the data terminal 0100A of a token, and ground line 1900B contacts the ground terminal 0100B of a token.

The example shown provides an interface to a standard PC's serial port. Lines RTS (pin 4) and DTR (pin 20) are used for a power supply in this embodiment, but either of these pins could optionally be used alone instead. When interfacing to a token, lines DTR and RST are driven to a positive voltage level, Zener diode 1910 holds the data line 1900A to a constant potential at all times. In the presently preferred embodiment, Zener 1910 is a 5 V Zener.

The serial data out pin TX (pin 2) is used, with a series resistor 1912, to modulate the ground line 1900B which is connected to the ground contact 0100B of the token. The serial data in pin RX (pin 3) is used to received data from the ground line 1900B. Thus, the token is in effect connected backwards.

Schottky diodes 1910 and 1914 clamp the excursion of the ground line 1900B. (These diodes can be implemented as a single 3-pin double-Schottky-diode package).

The reversed connection of the token turns out to be surprisingly advantageous. All of the RS232 interface chips presently on the market provide a trip point voltage of about 1.5 Volt (with about a half Volt of hysteresis). (This is not part of the formal RS232 specification, which simply defines the voltage range from −3 V to +3 V as a "dead zone".) Thus, this reversed connection, and the DC offset, assures that the modulation effected by the token module will fall into a range around the line receiver chip's trip point.

Software for Interfacing from Token to Standard UART

The TX and RX signals referred to above will normally by translated by a line/driver receiver chip (which converts the voltage levels to normal logic levels), and will then be connected to a universal asynchronous receiver/transmitter (UART) chip.

Such UART chips are a widely used commercial part. They include logic to perform low-level signal formatting and manipulation, and byte-wide serial/parallel conversion of data streams. One example of a commonly used UART chip, suitable for use in the embodiment of FIGS. 19 and 20, is an Intel 8250. However, a wide variety of other chips could be used instead.

UARTs are normally programmable, for parameters such as number of bits, baud rate, etc. Since each UART contains its own time base, timing parameters can specified to the UART without considering what the speed of operation of the overall system may be. (For example, the PC-type systems currently in widespread use range from XTs operating at 4.77 MHz to 80386 systems operating at 33 MHz.) In the presently preferred version of this embodiment, the serial data lines are interfaced to a UART which has been programmed for operation at 115 kilobaud, with 1 start bit, 6 data bits, and 1 stop bit per byte. However, these parameters can readily be varied: for example, even without changing the specific timing parameters of this embodiment, the number of data bits can be increased to seven or eight or more without causing any problems.

Figure 20:
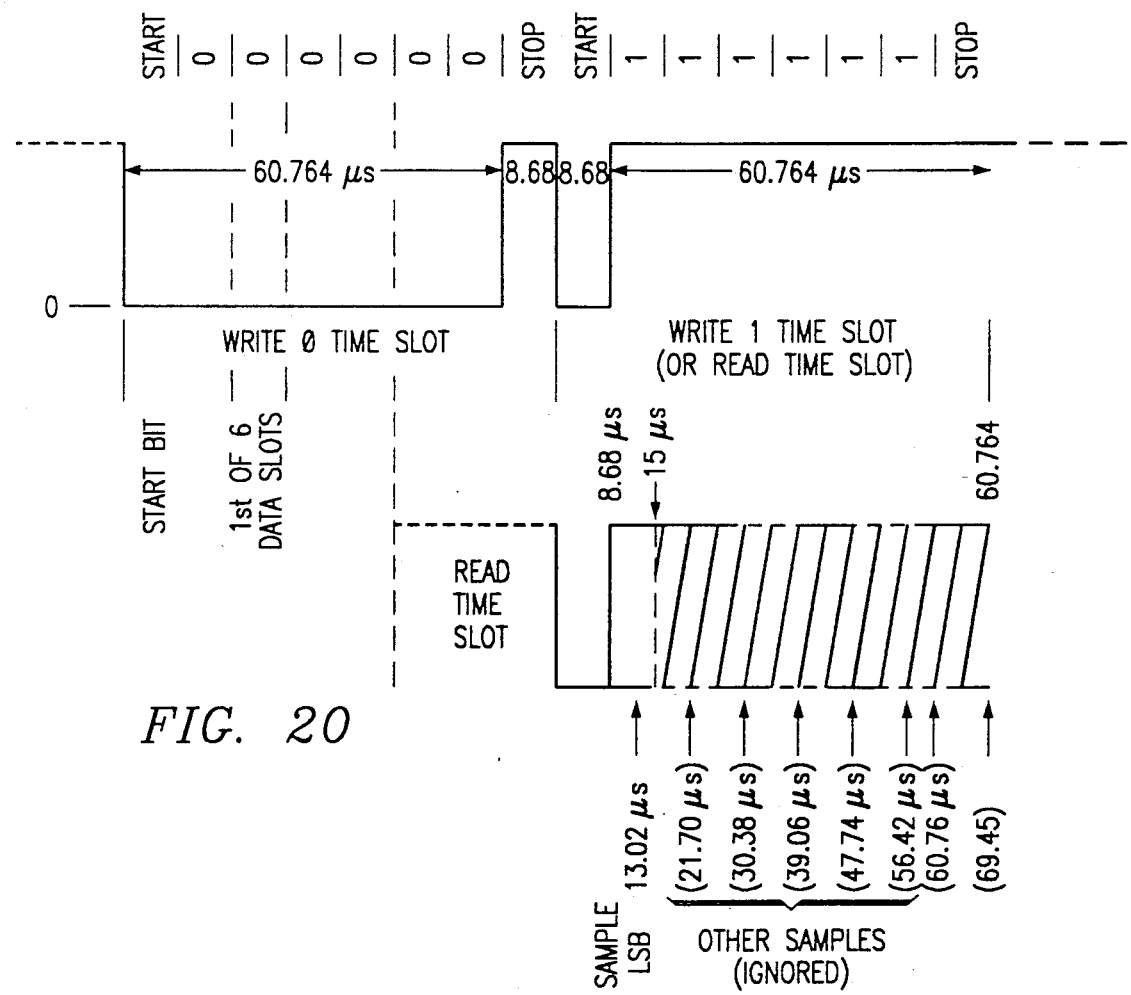
FIG. 20 shows timing relations preferably used, in a sample embodiment, for interfacing from a standard RS232 port to an electronic token.

FIG. 20 shows timing relations preferably used, in a sample embodiment, for interfacing from a standard RS232 port to an electronic token to perform a Write-0 operation. (These timing diagrams show signals with reference to the token's ground terminal, which, in this embodiment, is not the same as system ground.) When the UART sends a start bit, the token sees the falling edge which starts its time window. The start bit's time slot guarantees that the line level will be held low for 8.68 microseconds after the falling edge. Thereafter, the 6 data bits (all set to zero) keep the signal level low, from 8.68 microseconds after the falling edge until 60.764 microseconds after the falling edge. Thus, whenever the one-shot pulse ends, and the token samples the data line, it will see the desired data value. This is achieved by writing an entire byte of output for each bit desired. After the data bits, the stop bit provides a high level for 8.68 microseconds, which is more than long enough to reset the edge detector n the token.

A write-1 operation is almost the same as the write-0 operation, except that the data bits are all 1s (rather than all 0s).

the resistor 1912 means that signals driven onto the TX lie will be echoed on the RX line. This permits a simple read operation. After the token has been set into read mode, the host writes a byte of all 1s. At the same time, the receiving side of the UART will be receiving a byte of data. If the first received data bit is a zero, the host knows tha the module has turned on its pull-down transistor. If the first received data bit is a one, the host knows that the module has not turned on its pull-down transistor. The remaining data bits are ignored, since even if the pull-down transistor was on, the module may already have turned it off at any time after 15 microseconds past the falling edge.

Source Code—Software Interface

In the presently preferred embodiment, the following code is used to drive the serial interface to a token. In this listing, "TBE" means "Transmit Buffer empty"; "TSRE" means "Transmit Shift Register Empty," i.e. no data is currently being sent; "RDA" means "Received Data is Available," i.e. the receiver side of the UART is holding some data.

Thus, to perform a read operation, the host writes out hexadecimal byte $FF_H$ (or $3F_H$—with only six bits the two numbers appear the same. The first data bit in a byte is conventionally taken as the least significant bit. Therefore, the received data byte can simply be tested to see whether it is odd or even.

```
{
    This program performs a simple functionality test on a DS1272
    with 256 bit capacity and select bits of zero. The DS1272 is
    connected to COM1.
}
Uses CRT;                                          {Standard Pascal unit required for CRT control}
Procedure WByte(S: Word; X: Byte);
{
    This procedure sends out the byte X to the DS1272 connected
    to the serial port having port address S.
}
Var
    I: Byte;
Begin
    For I := 1 to 8 do Begin                                            {Send all eight bits in the byte}
        Repeat until Port[S+5]and $20 = $20;                            {Wait for TBE}
        If Odd(X) then Port[S] := $FF else Port[S] := 0;                {Send bit}
        X := X shr 1;                                                   {Shift in the next bit}
    End;
End;
Function RByte(S: Word): Byte;
{
    This function returns one byte received from the DS1272 connected
    to the serial port having port address S.
}
Var
    I,X,B : Byte;
        T : LongInt Absolute $40:$6C;                                   {System timer tick}
        M : LongInt;                                                    {Time limit}
Begin
    X := 0;                                                             {Collect the bits in X}
    M := T + 1;                                                         {Set the wait time limit}
    For I := 1 to 8 do Begin                                            {Receive all eight bits in the byte}
        Repeat until Port[S-5]and $40 = $40;                            {Wait for TSRE}
        If Port[S+5]and 1 = 1 then B := Port[S];                        {Clear receiver}
        Port[S] := $FF;                                                 {Send out read time slot}
        X := X shr 1;                                                   {Position byte to receive bit}
        Repeat until (Port[S-5]and 1 = 1) or (T > M);                   {Wait for RDA}
        If T > M then B := $FF else B := Port[S];                       {Get the bit}
        If Odd(B) then X := X or $80;                                   {Put new bit into byte}
    End;
    RByte := X;                                                         {Return the received byte}
End;
Const
    SB = 0;                                                             {Select Bits are zero}
    MS = 32;                                                            {Memory Size is 32 bytes}
Type
    DatAry = Array[0..31]of Byte;                                       {Data transfer buffer type}
Var
    PA : Word Absolute $40:0;                                           {Base port address of COM1}
    S  : String[31];                                                    {String to collect message}
    DA : DatAry;                                                        {Array of data to be transmitted}
    X,Y : Word;                                                         {Position of cursor}
    I  : Byte;                                                          {Array index}
    C  : Char;                                                          {Command character}
Begin                                                                   {Main program code begins here}
    Text Color(Yellow); Text Background(Blue); ClrScr;
    If PA = 0 then WriteLn('COM1 does not exist.') else Begin
        {
            This section sets up the serial port with port address PA for
            115200 baud with six data bits, one stop bit, and no parity.
        }
        Port[PA + 3] := $81;    {Set the DLAB}
        Port[PA + 0] := $01;    {Baud rate}
        Port[PA + 1] := $00;    {is 115200}
        Port[PA + 3] := $01;    {6 data, 1 stop, no parity}
        Port[PA + 1] := $00;    {No interrupts}
        Port[PA + 4] := $03;    {RTS and DTR on}
        {
            The next section provides a simple option menu for exercising
            the functions of the DS1272.
        }
        C := 'S';                      {Display options the first time through}
        While True do Begin
            If C = 'S' then Begin
                WriteLn('DS1272 Test Program'); WriteLn;
                WriteLn('I = Initialize DS1272');
                WriteLn('W = Write to DS1272');
                WriteLn('R = Read from DS1272');
                WriteLn('S = Show option list');
                WriteLn('<ESC> = End program');
                WriteLn;
```

```
        End;
    Write('Option = ');
    Repeat
        C := UpCase(ReadKey);
        If C = #27 then Begin       {Abort if ESC is received}
            WriteLn('<ESC>');
            WriteLn;Halt;
        End;
    Until (C = 'I') or (C = 'W') or (C = 'R') or (C = 'S');
    WriteLn(C);
    Case C of
        'I': For I := 0 to MS do WByte(PA,0);                    {Initialize DS1272}
        'W': Begin
            Write('Data to write = [');X := WhereX;Y := WhereY;
            Write('              ]');GotoXY(X, Y);
            ReadLn(S); DA := DatAry(S);                          {Transfer string to buffer}
            WByte(PA,SB shl 1 or SF9);                           {Send the command byte}
            For I := 0 to Pred(MS) do WByte(PA,DA[I]);           {Send data}
        End;
        'R': Begin
            WByte(PA,SB shl 1 or 1);                             {Send the command byte}
            For I := 0 to Pred(MS) do DA[I] := RByte(PA);        {Get data}
            If DA[0] > 31 then DA[0] := 31;                      {Limit length to 31}
            For I: = 1 to DA[0]do if (DA[I] < Byte(' '))
            or (DA[I] > Byte('z')) then DA[I] := Byte('.');
            DatAry(S) := DA;                                     {Transfer data to string}
            WriteLn('Message Received = [',S,']');               {Display it}
        End;
    End;
    WriteLn;
  End;
 End;
End.
```

Design Considerations

Since the token is designed to be used as a removable tagging device, it can be viewed at the system level as a memory element plagued by numerous cold solder joints. During either reading or writing operations, physical contact with the token may be broken. This in turn will cause either the received data to be erroneous or the transmitted data to be imcomplete. The recommended way around these problems is as follows:

1) Read Operation
   step 1—set token to a known state
   step 2—issued a read Command Word
   step 3—read the data into host memory
   step 4—repeat steps 1 through 3 five times
   step 5—use majority wins logic to derive data (i.e. 3 out of 5 wins)
2) Write Operation
   step 1—set token into known state
   step 2—issue a write Command Word
   step 3—write data into token memory
   step 4—perform Read Operation
   step 5—compare host transmit data to received data
   step 6—if not, equal, repeat steps 1 through 5.

Futher Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For example, by including integrated circuits with more security features (such as a DS1207 TimeKey ™ from Dallas Semiconductor Corporation), the innovative module bus architecture can also be used for applications where security is a high priority. Advantageous applications of this type may include "smart cards", personnel identification badges, and electronically verified currency.

For example, the RAM/ROM hybrid cell of FIG. 11 could alternatively be implemented with EPROM-type transistors. In this case, the combination of fuse 1130 and transistor 1140 would be replaced by a single floating-gate transistor. For another example, the laser-blown fuses 1130 used in the presently preferred embodiment of FIG. 11 could be replaced by electrically-blown fuses instead.

For another example, many advantages can be obtained by adapting the disclosed innovative concepts to a module which included electrically programmable elements (EEPROM memory or EEPAL logic) instead of battery-backed memory and logic. Such a module would be more expensive, and would require a modified bus protocol (so that the module could be powered from the data line while in contact with the host).

For another example, the board in the innovative module of FIG. 1 can be flexible or rigid, and can be made of conventional or other printed-circuit-board construction. Similarly, the one or more integrated circuits in the module can be packaged in a SOIC or other conventional package, or mounted using chip-on-board or chip-on-flex techniques, or mounted in other ways, as long as sufficient hermeticity is achieved. (Preferably the packaging technique is also selected to minimize cost.)

For another example, the innovative system and method disclosed for interfacing an electronic token to an RS232 port can be applied to serial ports using other standards. Even without exploiting the capabilities of UART chips, tokens can be interfaced to a very wide variety of serial ports, or to ports such as pins of the parallel printer port on a standard PC.

The contents of the data field in the module can be chosen by the systems designer, and a wide variety of formats can be used. Of course, some additional software would normally be used on the host side for Data Error Checking. For example, cyclic redundancy check bits may be encoded with the stored data, using a variety of methods.

Of course, a much more accurate time base in the module can be provided by using a higher battery voltage. However, the use of the low battery voltage of the presently preferred embodiment is advantageous in providing low cost and low power consumption. It should be noted that (in line with the discussion above regarding FIGS. 5A and 5B) that a more accurate time base could also be achieved by modifying the CMOS processing to lower the transistor's threshold voltages $V_{TP}$ and $V_{TN}$. However, as is well known to those skilled in the art of CMOS design, such a modification would carry its own costs (e.g. increased subthreshold current), and therefore is not presently preferred. However, it is important to note that some of the advantages of some of the disclosed innovations could be realized in such an environment.

It must be understood that the many innovative teachings set forth herein can be used separately. For example, a symmetric two-sided token package could be used instead, with a contact in the center of each face. This would not be as cheap nor as robust as the package of FIG. 1A, but many of the innovative teachings could be adapted for use in such an embodiment.

For another example, the charge consumption due to precharge of columns which are not being read during a memory access could be reduced by configuring the memory as multiple subarrays. (This might be particularly advantageous when using larger memory sizes.)

For another example, the packaging of the module can be widely varied, even within the context of a module which interfaces to a one-wire bus. For example, it is contemplated that a standard connector configuration (such as a subminiature 3/32″ phone plug) could be used to define pin placement for a data module. While such configurations are believed to be as advantageous as the principal preferred package embodiments, such alternative package embodiments do have their own advantages, and many the innovative teachings set forth herein can be used in such a context.

As will be recognized by those skilled in the art, the innovative concepts described in the present application can be modified and varied over a tremendous range of applications, and accordingly their scope is not limited except by the allowed claims.

What is claimed is:

1. A method for read/write interfacing from a serial port to a portable battery-powered open-collector electronic token data module over a one-wire-bus, comprising the steps of:

programming a receiver/transmitter chip, which has connections for a serial port's transmit-data line and a receive-data line, to operate at a baud rate which is specified in terms of invariant units, and which is much higher than the highest bit rate at which the module could be relied on to provide a reliable bit-by-bit interface;

operatively connecting said receiver/transmitter chip to the module through an output network which includes a substantial admittance between said transmit-data line and said receive-data line; and when data is sought to be written to said module, writing one byte of data onto said transmit-data line for each bit of data which is sought to be written into said module;

when data is sought to be read from said module, writing one byte of data onto said transmit-data line for each bit of data which is sought to be written into said module, and monitoring data values which are seen on said receive-data line while said transmit-data line is being driven, to ascertain the state of said module.

2. A subsystem for read/write interfacing from a host computer to a portable battery-powered open-collector electronic token data module over a one-wire-bus, comprising:

a receiver/transmitter chip, which has connections for a transmit-data line and a receive-data line;

an output network which includes a resistor having a substantial admittance between said transmit-data line and said receive-data line;

said output network being configured to tie the signal line of said one-wire bus to a fixed high potential, and to operatively connect the ground line of said module to said transmit-data line and said receive-data line.

3. The subsystem of claim 2, wherein said resistor has a resistance of less than 10 kilohms.

* * * * *